(12) United States Patent
Brandl et al.

(10) Patent No.: US 11,508,709 B2
(45) Date of Patent: Nov. 22, 2022

(54) LIGHT-EMITTING ARRANGEMENT AND METHOD FOR THE PRODUCTION THEREOF

(71) Applicant: Osram OLED GmbH, Regensburg (DE)

(72) Inventors: Martin Brandl, Kelheim (DE); Zeljko Pajkic, Regensburg (DE); Luca Haiberger, Regensburg (DE)

(73) Assignee: Osram OLED GmbH, Regensburg (DE)

(*) Notice: Subject to any disclaimer, the term of this patent is extended or adjusted under 35 U.S.C. 154(b) by 0 days.

(21) Appl. No.: 16/979,819

(22) PCT Filed: Feb. 7, 2019

(86) PCT No.: PCT/EP2019/053033
§ 371 (c)(1),
(2) Date: Sep. 10, 2020

(87) PCT Pub. No.: WO2019/174827
PCT Pub. Date: Sep. 19, 2019

(65) Prior Publication Data
US 2021/0057400 A1    Feb. 25, 2021

(30) Foreign Application Priority Data
Mar. 12, 2018   (DE) .......................... 102018105653.2

(51) Int. Cl.
*H01L 27/15* (2006.01)
*H01L 29/26* (2006.01)
(Continued)

(52) U.S. Cl.
CPC ........ *H01L 25/167* (2013.01); *H01L 25/0753* (2013.01); *H01L 33/0095* (2013.01);
(Continued)

(58) Field of Classification Search
CPC ............... H01L 25/167; H01L 25/0753; H01L 33/0095; H01L 33/486; H01L 33/502;
(Continued)

(56) References Cited

U.S. PATENT DOCUMENTS 6,729,025 B2   5/2004  Farrell et al.
2003/0211797 A1  11/2003  Hill et al.
(Continued)

FOREIGN PATENT DOCUMENTS

DE   102008026841 A1   8/2009
DE   102013206963 A1   11/2014
(Continued)

OTHER PUBLICATIONS

International Search Report and Written Opinion issued in International Patent Application No. PCT/EP2019/053033 dated Apr. 29, 2019.

*Primary Examiner* — Ismail A Muse
(74) *Attorney, Agent, or Firm* — ArentFox Schiff LLP

(57) ABSTRACT

The invention relates to a method, an arrangement and an array, in which a structured contact layer and an elastic carrier layer arranged on a first side of the structured contact layer and connected to the structure contact layer by means of a bonded connection is produced, and in which at least one optoelectronic semiconductor component is arranged on the structured contact layer, on a second side of the structured contact layer, opposing the first side, and is electrically and mechanically connected to the structured contact layer, an elastic conversion layer in an irradiation region being applied to the structured contact layer and the elastic carrier layer in such a way that at least the optoelectronic semiconductor component is embedded in the conversion layer, at least in sections, and a connection region of the structure contact layer remains uncovered.

10 Claims, 17 Drawing Sheets

(51) Int. Cl.
- *H01L 31/12* (2006.01)
- *H01L 33/00* (2010.01)
- *H01L 25/16* (2006.01)
- *H01L 25/075* (2006.01)
- *H01L 33/48* (2010.01)
- *H01L 33/50* (2010.01)
- *H01L 33/62* (2010.01)
- *H01S 5/40* (2006.01)

(52) U.S. Cl.
CPC .......... *H01L 33/486* (2013.01); *H01L 33/502* (2013.01); *H01L 33/62* (2013.01); *H01S 5/4025* (2013.01); *H01L 2933/0041* (2013.01); *H01L 2933/0066* (2013.01)

(58) Field of Classification Search
CPC ............. H01L 33/62; H01L 2933/0041; H01L 2933/0066; H01L 2224/97; H01L 2933/0033; H01S 5/4025
See application file for complete search history.

(56) References Cited

U.S. PATENT DOCUMENTS

| | | | |
|---|---|---|---|
| 2006/0102915 A1* | 5/2006 | Kim | H01L 33/505 257/98 |
| 2009/0057690 A1 | 3/2009 | Chakraborty | |
| 2011/0297994 A1 | 12/2011 | Sugizaki et al. | |
| 2012/0267663 A1* | 10/2012 | Park | H01L 33/54 257/98 |
| 2016/0365484 A1* | 12/2016 | Jeong | H01L 33/62 |
| 2018/0226552 A1* | 8/2018 | Lee | H01L 33/56 |
| 2020/0105440 A1* | 4/2020 | Mahajan, Jr. | B32B 7/06 |

FOREIGN PATENT DOCUMENTS

| | | |
|---|---|---|
| DE | 102013109890 A1 | 3/2015 |
| DE | 102016214588 A1 | 2/2018 |
| WO | 2017030851 A2 | 2/2017 |

\* cited by examiner

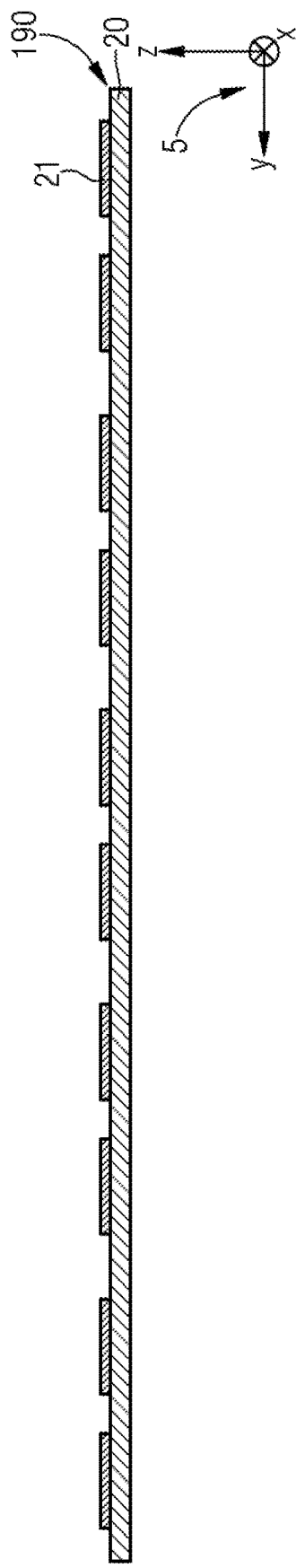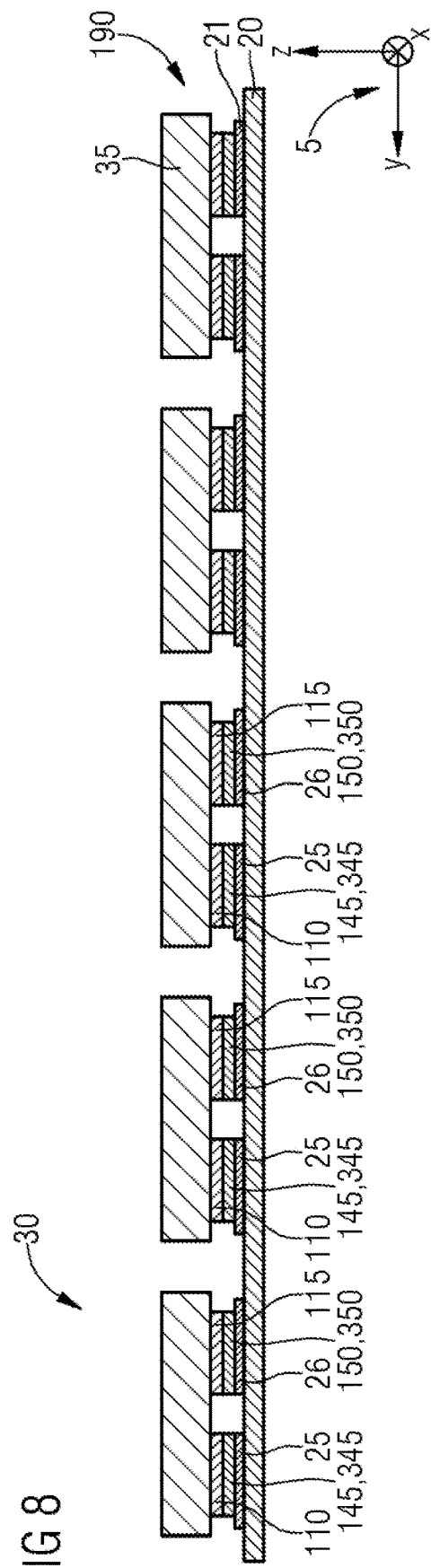

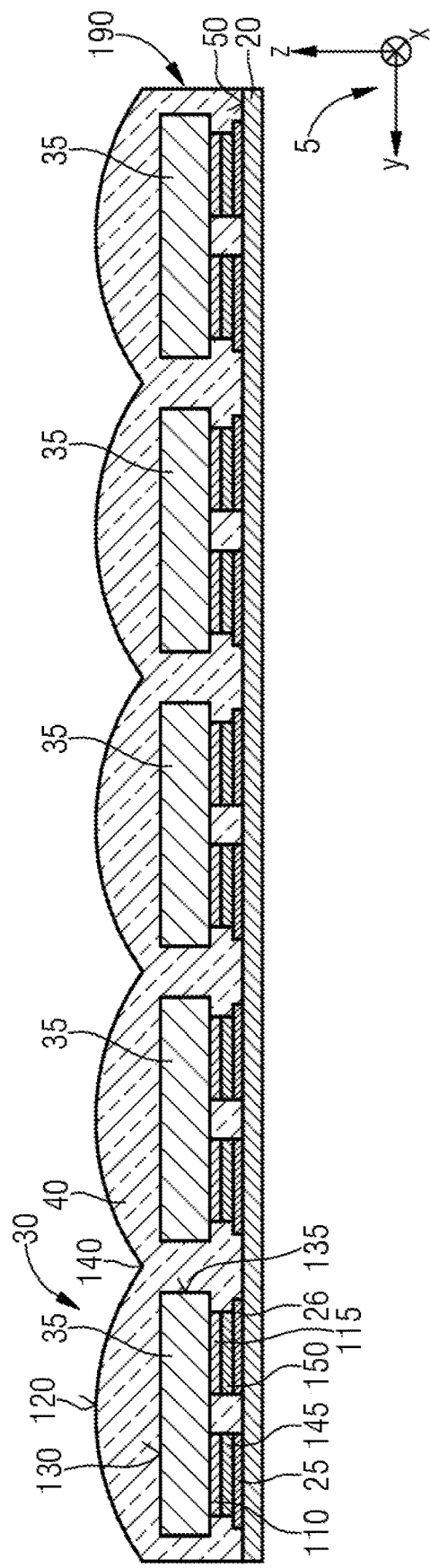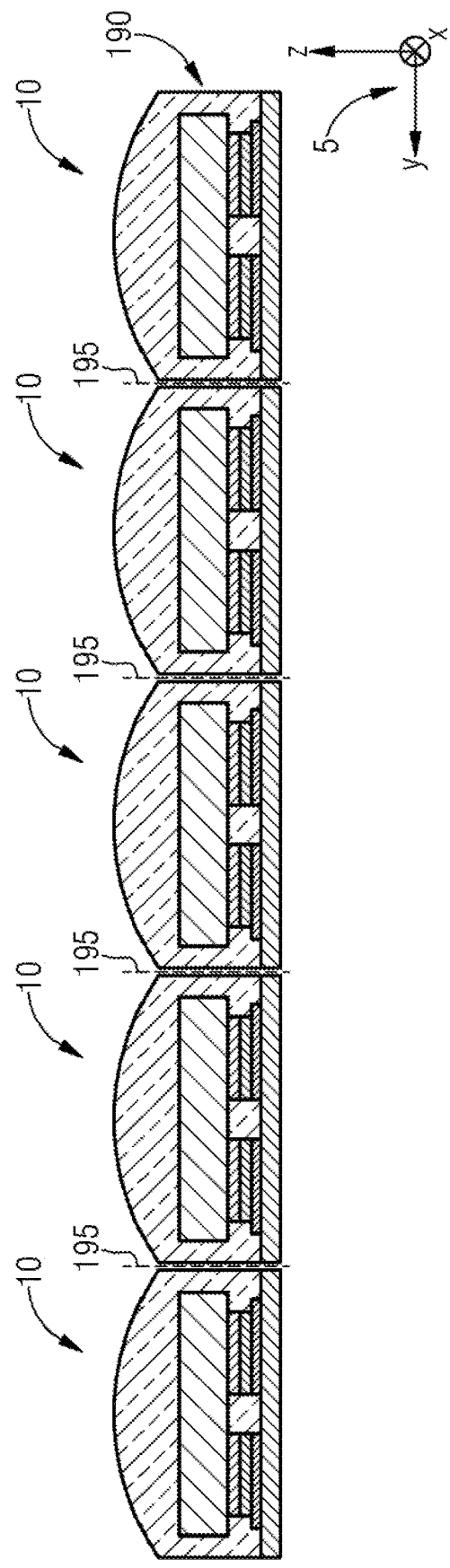

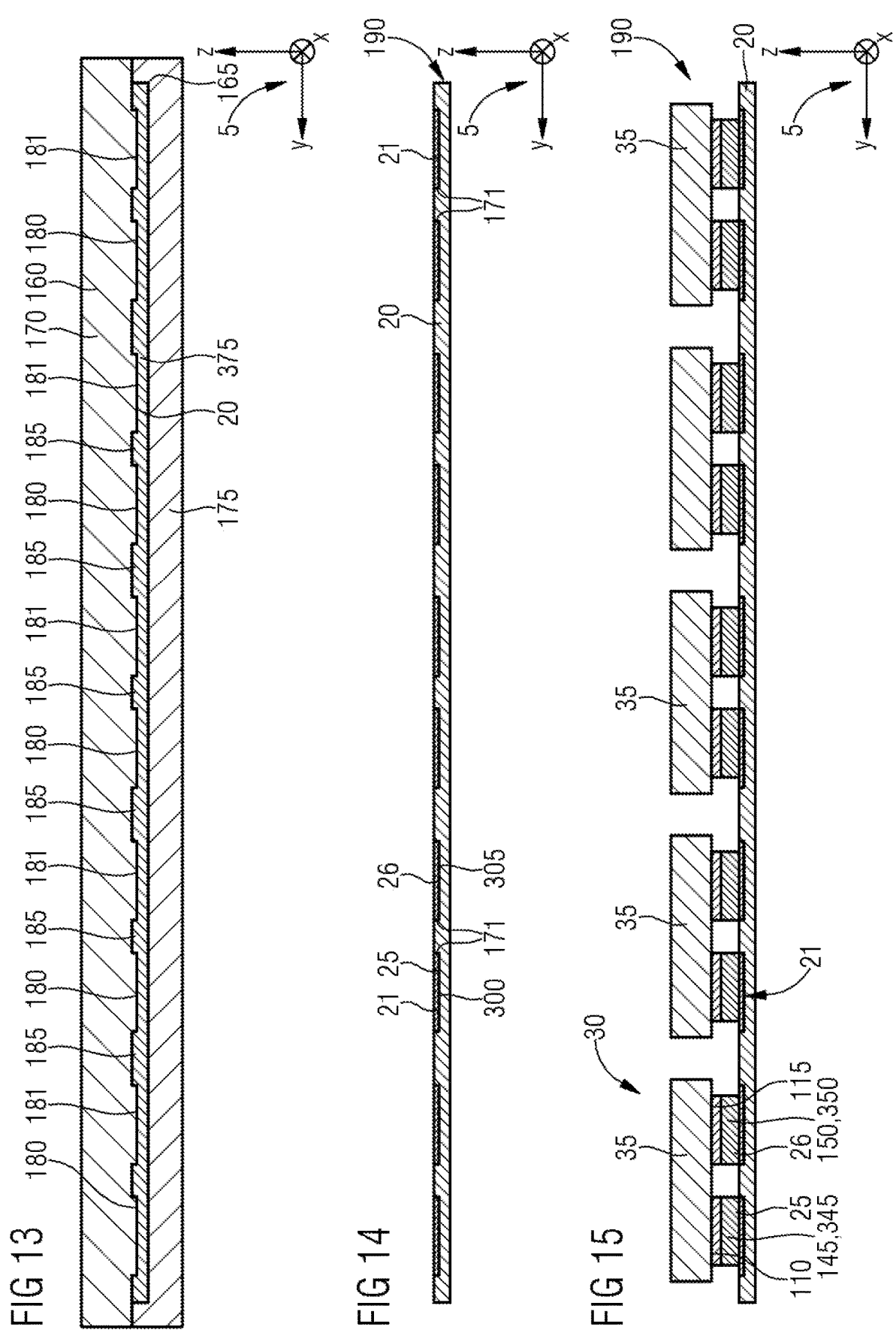

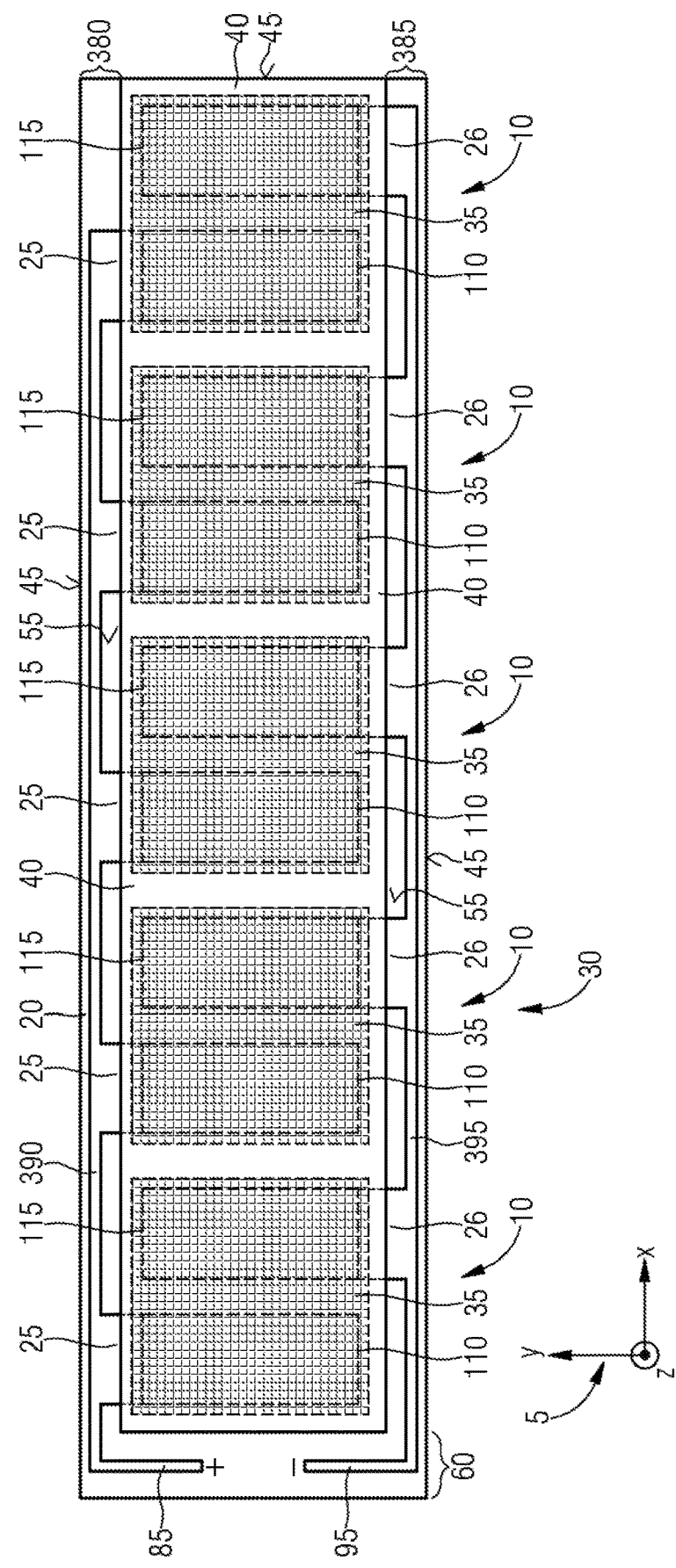

LIGHT-EMITTING ARRANGEMENT AND METHOD FOR THE PRODUCTION THEREOF

This application is a 35 U.S.C. § 371 National Phase of PCT Application No. PCT/EP2019/053033, filed Feb. 7, 2019, which claims priority to German Patent Application No. 102018105653.2, filed Mar. 12, 2018, the disclosures of which are hereby incorporated by reference herein in their entireties.

The invention relates to a method for producing an arrangement, an arrangement and an array according to aspects of the present disclosure.

A flexible, light-emitting textile display is known from EP 2 784 198 A1.

It is an object of the invention to provide an improved method for producing an arrangement and an improved arrangement.

This object is achieved by means of a method and an arrangement according to aspects of the present disclosure. Advantageous embodiments are specified below.

It has been recognized that an improved method for producing an arrangement may be provided by virtue of the fact that a structured contact layer and an elastic carrier layer arranged at a first side of the structured contact layer and connected to the structured contact layer by means of a cohesive connection are provided, wherein on a second side of the structured contact layer located opposite the first side, at least one optoelectronic semiconductor component is arranged on the structured contact layer and is electrically and mechanically connected to the structured contact layer, wherein a conversion layer comprising an elastic matrix material is applied to the structured contact layer and the elastic carrier layer in such a way that the optoelectronic semiconductor component is embedded in the conversion layer at least in sections.

This configuration has the advantage that the arrangement is producible particularly simply and cost-effectively. Furthermore, a stiff circuit board material is dispensed with, such that the arrangement produced by means of the method is particularly pliable and flexible and is suitable in particular for garments or banners.

In a further embodiment, a mold is heated to a predefined temperature, wherein a first reactant and a second reactant are introduced into a mold space of the mold, wherein at least a first portion of the first reactant and of the second reactant crosslink with one another to form an elastic first material of the elastic carrier layer, wherein temporally following the crosslinking of the first portion of the first reactant and second reactant, the structured contact layer is applied to the partly crosslinked elastic carrier layer, wherein temporally following the application of the structured contact layer to the elastic carrier layer, a second portion of the first reactant and of the second reactant crosslink to form the first material of the elastic carrier layer and the cohesive connection to the structured contact layer is formed. As a result, a number of method steps for production may be kept particularly small, such that the method for producing the arrangement is particularly cost-effective.

In a further embodiment, the structured contact layer is cut or stamped from a metal film, wherein temporally following the at least partial removal of the elastic carrier layer from the mold, the first side of the structured contact layer is placed areally onto the elastic carrier layer, wherein the structured contact layer and the elastic carrier layer are pressed together. As a result, a particularly flexible arrangement is achieved and at the same time a particularly simple production method is provided.

In a further embodiment, a mold is heated to a predefined temperature, wherein a first reactant and a second reactant are introduced into a mold space of the mold, wherein at least a first portion of the first reactant and of the second reactant crosslink with one another to form an elastic first material of the elastic carrier layer, wherein at least one first cavity of the elastic carrier layer is formed, wherein a third reactant and a fourth reactant are introduced into the first cavity, wherein the third reactant and the fourth reactant crosslink with one another and form the structured contact layer in the first cavity. This configuration has the advantage that the conductive layer and the first material may be cured simultaneously, such that the required time for producing the arrangement is particularly short and such that a particularly high number of arrangements is producible within a predefined time interval in mass production.

In a further embodiment, temporally following the introduction of the third reactant and the fourth reactant into the first cavity, a second portion of the first reactant and of the second reactant crosslink to form the first material of the elastic carrier layer and at the same time the third reactant and the fourth reactant crosslink with one another and form the structured contact layer in the first cavity.

In a further embodiment, the first reactant and the third reactant and/or the second reactant and the fourth reactant are identical. As a result, a particularly good cohesive connection between the structured contact layer and the elastic carrier layer may be achieved.

In a further embodiment, the third reactant and/or the fourth reactant are introduced into the first cavity by means of screen printing or by means of a dispenser.

In a further embodiment, a layer of a conductive adhesive is applied to the second side of the structured contact layer, wherein the optoelectronic semiconductor component is placed onto the layer by way of at least one first contact pad. Alternatively, a layer of a conductive adhesive is applied on a first contact pad of the optoelectronic semiconductor component, wherein the optoelectronic semiconductor component is placed onto the second side of the conductive layer by way of the layer, wherein the conductive adhesive is cured to form an electrically conductive, elastic connecting layer.

In a further embodiment, the conversion layer is applied to the elastic carrier layer in such a way that at least one connection region of the conductive layer on a side of the conductive layer facing away from the elastic carrier layer is not covered by the conversion layer and the optoelectronic semiconductor component is preferably completely embedded into the conversion layer. This ensures that the optoelectronic semiconductor component is protected against external environmental influences. Furthermore, a high luminous efficiency of the arrangement is ensured.

The arrangement produced by means of the method described above comprises an elastic carrier layer, a structured contact layer, at least one optoelectronic semiconductor component and a conversion layer, wherein the elastic carrier layer comprises an electrically nonconductive, elastic first material, wherein the elastic carrier layer is connected to a first side of the structured contact layer by means of a cohesive connection, wherein the structured contact layer comprises an electrically conductive and elastic second material, wherein on a second side of the structured contact layer located opposite the first side, the conductive layer is electrically and mechanically connected, preferably by means of an elastic connecting layer, to a first contact pad of the optoelectronic semiconductor component, wherein at least the optoelectronic semiconductor component is embedded in the conversion layer and a connection region of the conductive layer, for the contacting of the structured contact layer, is not covered by the conversion layer.

This configuration has the advantage that the arrangement comprises a particularly high mechanical moldability and bendability. Furthermore, when the arrangement is used in a garment, the arrangement adapts flexibly to a body shape and may follow a movement of the body.

In a further embodiment, the structured contact layer comprises at least one first conductive layer and one second conductive layer, wherein the second conductive layer is arranged offset with respect to the first conductive layer, wherein the elastic carrier layer electrically insulates the first conductive layer from the second conductive layer, wherein the optoelectronic semiconductor component comprises the second contact pad, wherein the second contact pad is arranged offset with respect to the first contact pad, wherein the first contact pad is connected to the first conductive layer by means of the elastic connecting layer, wherein the second contact pad is mechanically and electrically connected to the second conductive layer.

In a further embodiment, at least one first cavity is arranged in the elastic carrier layer, wherein the first cavity is filled, preferably completely, with the first conductive layer of the structured contact layer, wherein the first cavity comprises a cavity base, wherein the cavity base fluidically separates the first cavity from a side of the elastic carrier layer facing away from the structured contact layer. Alternatively, the first cavity extends over an entire thickness of the elastic carrier layer and is open on a side facing away from the optoelectronic semiconductor component.

In a further embodiment, at least one second cavity is arranged in the elastic carrier layer, wherein the second cavity is arranged offset with respect to the first cavity, wherein a web of the elastic carrier layer for fluidically separating the first cavity from the second cavity is arranged between the first cavity and the second cavity, wherein the second cavity is filled, preferably completely, with the second conductive layer of the structured contact layer.

In a further embodiment, the elastic carrier layer comprises a carrier matrix, wherein the carrier matrix comprises one of the following elastic first materials: elastic plastic, silicone, LRI silicone (LRI=low refractive index), HRI silicone (HRI=high refractive index), wherein the structured contact layer comprises at least one of the following second materials: silver, crosslinked conductive adhesive, crosslinked silver adhesive, aluminum, steel, gold, film material, silver film, steel film, gold film, copper, nickel, tin, copper film, nickel film, tin film, and/or wherein the elastic connecting layer is electrically conductive and comprises a further carrier matrix, wherein the further carrier matrix comprises one of the following elastic further materials: elastic plastic, silicone, LRI silicone (LRI=low refractive index), HRI silicone (HRI=high refractive index), wherein the further material and the first material are identical, and/or wherein the optoelectronic semiconductor component comprises an LED or a laser diode.

An improved array may be provided by virtue of the fact that the array comprises a plurality of arrangements formed as described above, wherein the elastic carrier layers of the arrangements are formed integrally and material-uniformly, wherein the optoelectronic semiconductor components are arranged at a distance from one another in a predefined pattern.

The above-described properties, features and advantages of this invention and the way in which they are achieved will become clearer and more clearly understood in association with the following description of the exemplary embodiments which are explained in greater detail in association with the drawings, in which:

FIG. 7 shows a sectional view through a composite comprising elastic carrier layer and structured contact layer during a sixth method step;

FIG. 8 shows a sectional view through the composite during a ninth method step;

FIG. 9 shows a sectional view through the composite during an eleventh method step;

FIG. 10 shows a sectional view through the composite following a twelfth method step;

FIG. 13 shows a sectional view through the elastic carrier layer and the mold during a second method step;

FIG. 14 shows a sectional view through the elastic carrier layer during a fifth method step;

FIG. 15 shows a sectional view through a composite following a seventh method step;

FIG. 28 shows a plan view of an array in accordance with a second embodiment.

In the following figures, a coordinate system 5 is illustrated to facilitate orientation. The coordinate system 5 is formed as a right-handed system and comprises an x-axis (longitudinal direction), a y-axis (transverse direction) and a z-axis (height direction).

Figure 1:
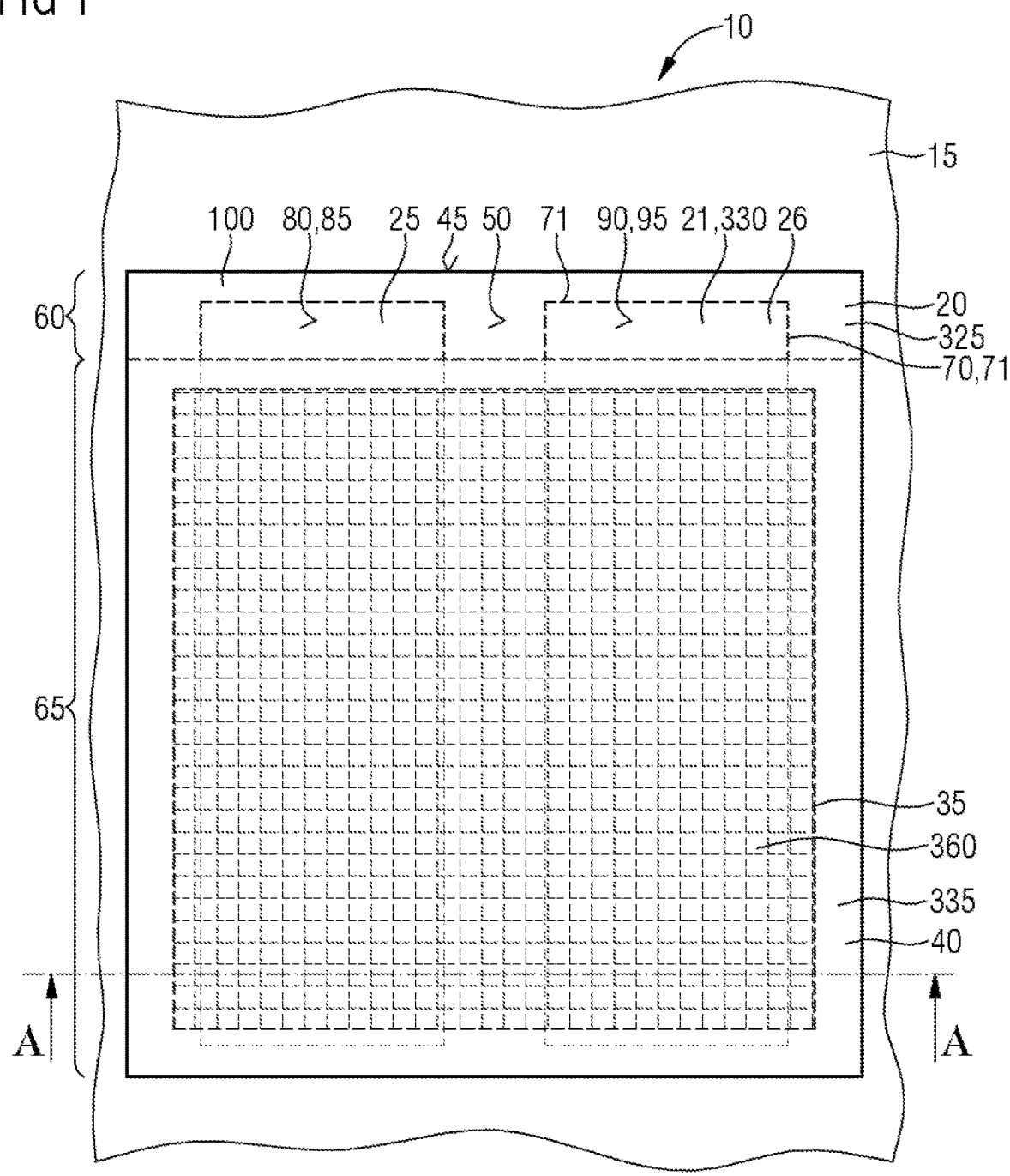
FIG. 1 shows a plan view of an arrangement in accordance with a first embodiment.

FIG. 1 shows a plan view of an arrangement 10 in accordance with a first embodiment.

The arrangement 10 may comprise a textile 15, preferably a textile fabric or a multilayered textile. Furthermore, the arrangement 10 comprises an elastic carrier layer 20, a structured contact layer 21, at least one optoelectronic semiconductor component 35 and a conversion layer 40.

The elastic carrier layer 20 is arranged on the top side of the textile 15, for example. The textile 15 is illustrated only in part in FIG. 1. At a first underside 55 (hidden in FIG. 1) of the elastic carrier layer 20, the elastic carrier layer 20 may be connected to the textile 15 by means of a positively locking, cohesive and/or force-locking connection. Moreover, it is possible to dispense with the textile 15 in the arrangement 10. The textile 15 is formed in an elastically bendable fashion and may be part of a garment or banner, for example.

The elastic carrier layer 20 comprises a first carrier matrix. The first carrier matrix comprises an elastic first material 325. The first material 325 is formed in an electrically nonconductive fashion. The first carrier matrix may comprise at least one of the following first materials 325: elastic plastic, silicone, LRI silicone (LRI=low refractive index), HRI silicone (HRI=high refractive index).

Furthermore, the elastic carrier layer 20 may comprise at least one of the following first particle materials embedded in the first carrier matrix: reflection particle material, titanium dioxide, carbon black, color particles.

The first material 325 is understood to be elastic if the first material 325 comprises at least a tensile strength in a range of 1 MPa to 10 MPa. Preferably, the tensile strength is approximately 4 MPa. Furthermore, the first material is elastic if it is bendable without damage reversibly by at least 20°, preferably at least 60°, in particular at least 120°, without the first material 325 thereby incurring damage.

The elastic carrier layer 20 preferably comprises a first layer thickness (in the z-direction) of 30 µm to 500 µm, particularly advantageously of 70 µm to 130 µm. Furthermore, is advantageous if the first layer thickness is 100 µm.

In the embodiment, the elastic carrier layer 20 comprises a rectangular configuration in plan view, for example. The configuration of the elastic carrier layer 20 in terms of its geometry is by way of example. The elastic carrier layer 20 may also be configured differently.

The elastic carrier layer 20 comprises four side faces 45. The four side faces 45 are perpendicular to the plane of the drawing and are arranged at right angles to one another, for example. In the embodiment, the side faces 45 are formed in a planar fashion, for example. Moreover, it is conceivable for the side faces 45 to be arranged in a curved fashion or in an inclined fashion with respect to one another. In this regard, by way of example, the elastic carrier layer 20 may also be formed in a square, trapezoidal, polygonal, elliptic or circular fashion in plan view. Moreover, the side face 45 may be formed as curved in itself and may be adapted to the cut of the textile 15 or of the garment.

The elastic carrier layer 20 comprises a first top side 50 on a side facing the observer. In the embodiment, the first top side 50 is arranged on a side facing away from the textile 15, for example. In the embodiment, the first top side 50 is formed in a substantially planar fashion. In this case, planar is understood to means that the first top side 50 is substantially free of structurally planned elevations or indentations. The structured contact layer 21 is arranged on the first top side 50.

The structured contact layer 21 is arranged by way of a second underside 70 on the first top side 50 of the elastic carrier layer 20 and is preferably connected to the elastic carrier layer 20 by means of a cohesive connection 71. The structured contact layer 21 comprises a first conductive layer 25 and a second conductive layer 26. The second conductive layer 26 is arranged laterally offset with respect to the first conductive layer 25. As a result of the lateral offset of the first conductive layer 25 and the second conductive layer 26 and also the electrically nonconductive first material 325 of the elastic carrier layer 20, the first conductive layer 25 is electrically insulated from the second conductive layer 26.

The arrangement 10 comprises a connection region 60 and a radiation region 65 adjacent to the connection region 60 in the x-direction. In the connection region 60 of the arrangement 10, a second top side 80 of the first conductive layer 25, a third top side 90 of the second conductive layer 26 and the first top side 50 of the elastic carrier layer 20 (in the regions in which the first top side 50 is not covered by the structured contact layer 21) are free at the top side. In the connection region 60, the structured contact layer 21 comprises at the top side a first connection pad 85 for contacting the first conductive layer 25 at the top side. By way of example, a first electrical line for connecting the arrangement 10 to a first pole of an electrical energy source or a driver circuit may be connected to the first connection pad 85.

The second conductive layer 26 comprises a second connection pad 95 in the connection region 60 at the third top side 90. At the second connection pad 95, the second conductive layer 26 may be contacted at the top side. In particular, a second electrical line may be connected to the second connection pad 95 in order to electrically connect the second conductive layer 26 to a second pole of the electrical energy source or the driver circuit.

In the embodiment, the first conductive layer 25 and the second conductive layer 26 are arranged at a distance from the side face 45 of the elastic carrier layer 20. In particular, an edge region 100 is provided between the first connection pad 85 and the side face 45 and also between the second connection pad 95 and the side face 45, wherein the edge region 100 is likewise free at the top side in the connection region 60 of the arrangement 10, such that the first top side 50 of the elastic carrier layer 20 is not covered in the edge region 100. The edge region 100 may serve for example to connect the elastic carrier layer 20 to the textile 15 by means of sewing or a welding method, without the structured contact layer 21 being pierced or damaged in some other way (mechanically and/or thermally).

The structured contact layer 21 comprises at least one of the following second materials 330: aluminum, steel, gold, steel film, gold film, silver film, copper, nickel, tin, copper film, nickel film, tin film. The structured contact layer 21 comprises a second layer thickness of 100 nm to 50 µm.

The optoelectronic semiconductor component 35 is arranged in the radiation region 65, which is laterally adjacent to the connection region 60 in FIG. 1.

The optoelectronic semiconductor component 35, on the underside (hidden in FIG. 1), is electrically connected to the first conductive layer 25 by way of a first contact pad 110 and to the second conductive layer 26 by way of a second contact pad 115. The conductive layers 25, 26 are configured to transmit the electrical energy provided during the operation of the optoelectronic semiconductor component 35.

The optoelectronic semiconductor component 35 may be for example an LED chip, in particular an LED flip-chip, or a laser diode. During the operation of the optoelectronic semiconductor component 35, the optoelectronic semiconductor component 35 emits a first electromagnetic radiation from a first wavelength range. The first wavelength range may be in the range of visible and/or non-visible light.

Furthermore, the conversion layer 40 is provided exclusively in the radiation region. The conversion layer 40 extends over the entire region of the radiation region 65 and ends at the side faces 45 of the elastic carrier layer 20. The conversion layer 40 adjoins the first top side 50 and also the second and third top sides 80, 90 of the conductive layer 25, 26 at the underside and covers the elastic carrier layer 20 and also the first and second conductive layers 25, 26 in such a way that the optoelectronic semiconductor component 35 is embedded, preferably completely, in the conversion layer 40. The conversion layer 40 may be formed in a planar fashion at the top side. Alternatively, it is also conceivable for the conversion layer 40 to be formed in a lens-shaped fashion at the top side.

The conversion layer 40 comprises a second carrier matrix and a conversion material 360 embedded in the second carrier matrix. The second carrier matrix comprises at least one of the following third materials 335: elastic plastic, silicone, LRI silicone (LRI=low refractive index), HRI silicone (HRI=high refractive index).

It is particularly advantageous if the first material 325 of the first carrier matrix and the third material 335 of the second carrier matrix are identical, such that the conversion layer 40 and the elastic carrier layer 20 comprise substantially the same elasticity and tensile strength.

The conversion material 360 is configured to convert the first electromagnetic radiation with the first wavelength range into a second electromagnetic radiation from a second wavelength range, wherein the second wavelength range is different than the first wavelength range.

The second electromagnetic radiation is emitted from the conversion layer 40 at the top side on a side facing away from the elastic carrier layer 20.

Figure 2:
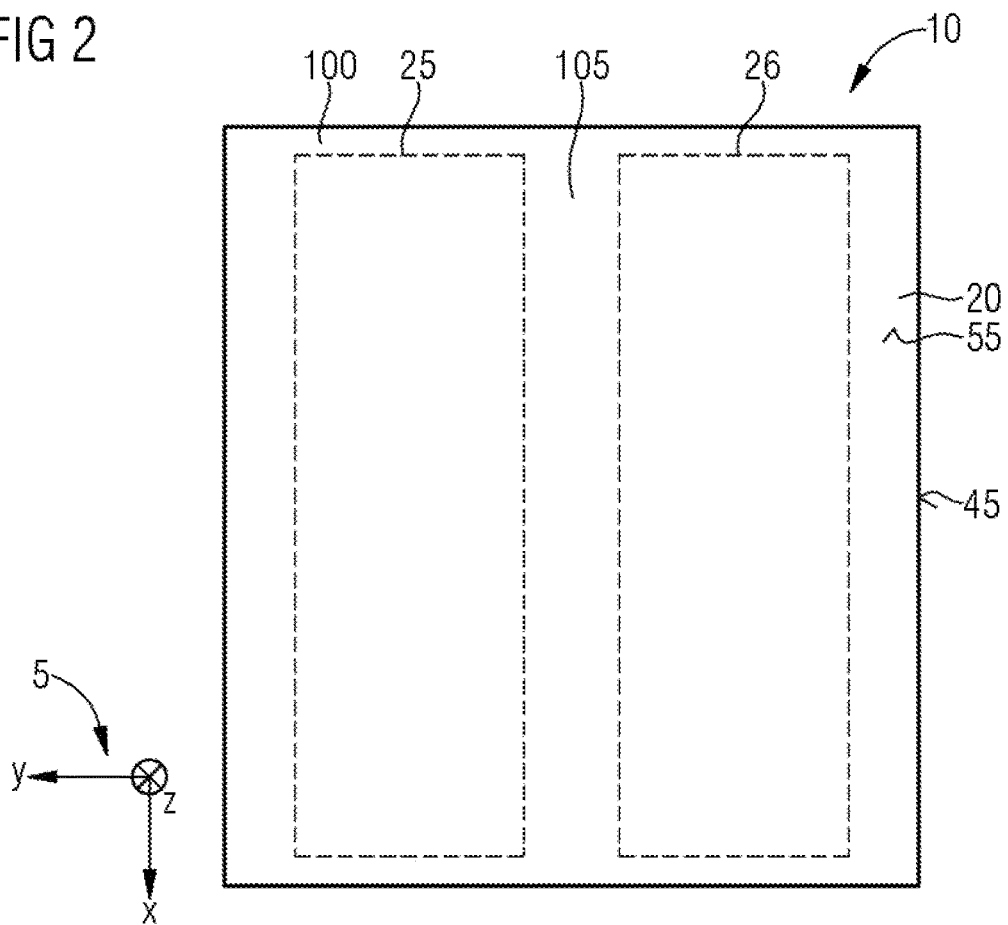
FIG. 2 shows a bottom view of the arrangement shown in FIG. 1.

FIG. 2 shows a bottom view of the arrangement 10 shown in FIG. 1, the illustration of the textile 15 being dispensed with.

The elastic carrier layer 20 is formed without interruptions at the first underside 55. In this case, without interruptions is understood to mean that substantially no intended cutouts, holes or the like that extend in the direction of the first top side 50 are provided at/in the first underside 55. As a result of the configuration of the first underside 55 of the elastic carrier layer 20 without interruptions, the optoelectronic semiconductor component 35 may be protected against environmental influences, in particular against moisture, in particular perspiration. A long lifetime of the arrangement 10 is ensured as a result.

The extent of the first conductive layer 25 and of the second conductive layer 26 at the top side of the elastic carrier layer 20 is illustrated by means of dashed lines in FIG. 2. In this case, an interspace 105 of the elastic carrier layer 20 is provided between the first conductive layer 25 and the second conductive layer 26. The interspace 105 electrically isolates the first conductive layer 25 from the second conductive layer 26.

Furthermore, the edge region 100 is arranged peripherally, following the side faces 45. This ensures that the conductive layer 25, 26 is exposed at the top side exclusively in the connection region 60. The structured contact layer 21 is covered in the radiation region 65. The structured contact layer 21 is concealed at the side face 45, too, such that corrosion of the structured contact layer 21 may be reliably avoided.

Figure 3:
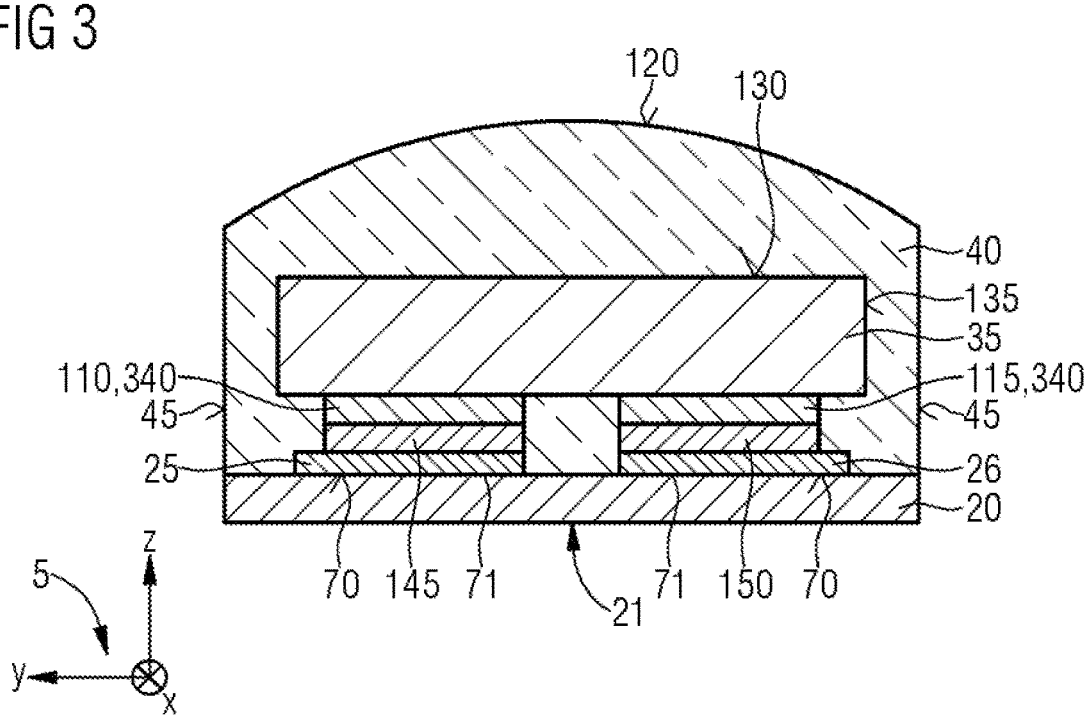
FIG. 3 shows a sectional view along a sectional plane A-A shown in FIG. 1 through the arrangement shown in FIG. 1.

FIG. 3 shows a sectional view along a sectional plane A-A shown in FIG. 1 through the arrangement 10 shown in FIG. 1.

In the embodiment, the optoelectronic semiconductor component 35 is formed as a flip-chip, for example, and comprises on the underside, at a side facing the structured contact layer 21, the first contact pad 110 and a second contact pad 115, which is arranged laterally offset with respect to the first contact pad 110 in the transverse direction.

In the embodiment, the optoelectronic semiconductor component 35 emits the first electromagnetic radiation by way of a chip top side 130. It goes without saying that the optoelectronic semiconductor component 35 may also be formed as an edge emitting optoelectronic semiconductor component 35, such that the optoelectronic semiconductor component 35 emits the first electromagnetic radiation by way of a chip side face 135, which is preferably arranged in a perpendicularly inclined manner with respect to the elastic carrier layer 20. In the embodiment, the chip top side 130 is formed parallel to the first top side 50 of the elastic carrier layer 20. The elastic carrier layer 20 extends in one plane in FIG. 3.

In one embodiment, a fourth top side 120 of the conversion layer 40 is formed in a lens-shaped fashion. In this case, the fourth top side 120 of the conversion layer 40 is formed convexly relative to the optoelectronic semiconductor component 35 above the optoelectronic semiconductor component 35, such that the fourth top side 120 falls toward the side face 45.

The optoelectronic semiconductor component 35, by way of the first contact pad 110, is cohesively connected to the first conductive layer 25 by means of a first elastic connecting layer 145. The second contact pad 115 is cohesively connected to the second conductive layer 26 by means of a second elastic connecting layer 150. The first elastic connecting layer 145 and the second elastic connecting layer 150 are formed in a layerlike fashion between the contact pad 110, 115 and the respectively assigned first and second conductive layer 25, 26. In the embodiment, the first elastic connecting layer 145 and the second elastic connecting layer 150 are formed substantially identically. The first elastic connecting layer 145 electrically connects the first contact pad 110 to the first conductive layer 25 and the second elastic connecting layer 150 electrically connects the second contact pad 115 to the second conductive layer 26.

The elastic connecting layer 145, 150 is formed in such a way that the elastic connecting layer 145, 150 allows bending of the underlying conductive layer 25, 26 and of the elastic carrier layer 20 and counterbalances the latter vis-à-vis the stiffly formed contact pads 110, 115 of the optoelectronic semiconductor component 35, thereby reliably avoiding detachment of the elastic connecting layer 145, 150 at the contact pad 110, 115 in the event of the arrangement 10 being subjected to bending stress.

It is particularly advantageous if the elastic connecting layer 145, 150 is electrically conductive and comprises a third layer thickness of 2 µm to 50 µm. In this case, the elastic connecting layer 145, 150 preferably comprises a tensile strength in a range of 1 MPa to 10 MPa. Preferably, the tensile strength is approximately 4 MPa.

Furthermore, it is advantageous if the elastic connecting layer 145, 150 comprises at least one third carrier matrix comprising at least one of the following fourth materials

340: elastic plastic, silicone, LRI silicone (LRI=low refractive index), HRI silicone (HRI=high refractive index), epoxy resin, electrically conductive polymer. It is particularly advantageous if the first material 325 and the fourth material 340 are identical.

In addition, the elastic connecting layer 145, 150 may comprise at least one of the following second particle materials: silver, gold, nickel, copper, graphite, iron, aluminum, tin. The second particle material is embedded in the third carrier matrix and, in the case of an electrically nonconductive third carrier matrix, ensures that the elastic connecting layer 145, 150 is electrically conductive.

Figure 4:
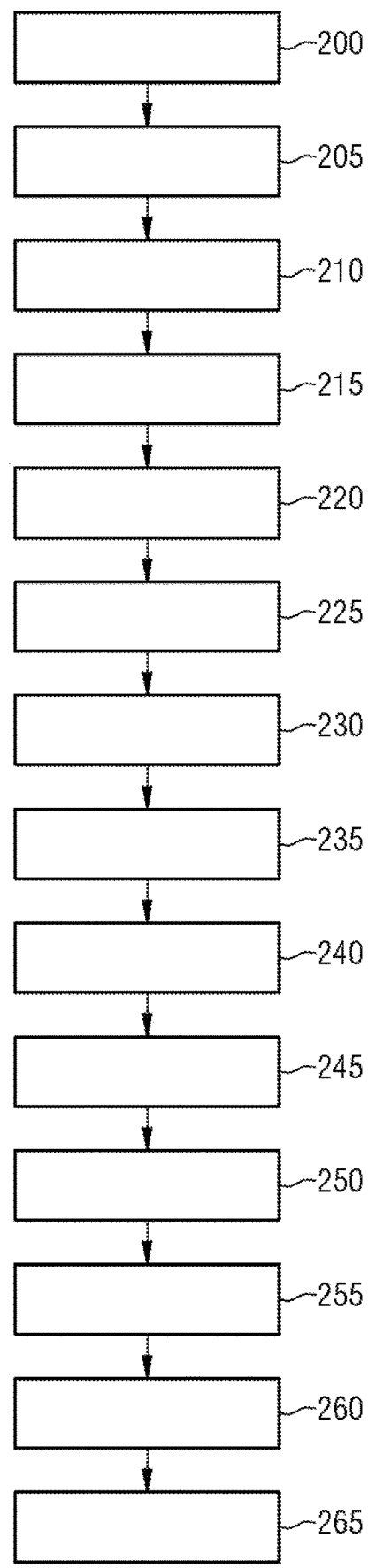
FIG. 4 shows a flow diagram of a method for producing the arrangement shown in FIGS. 1 to 3.
Figure 5:
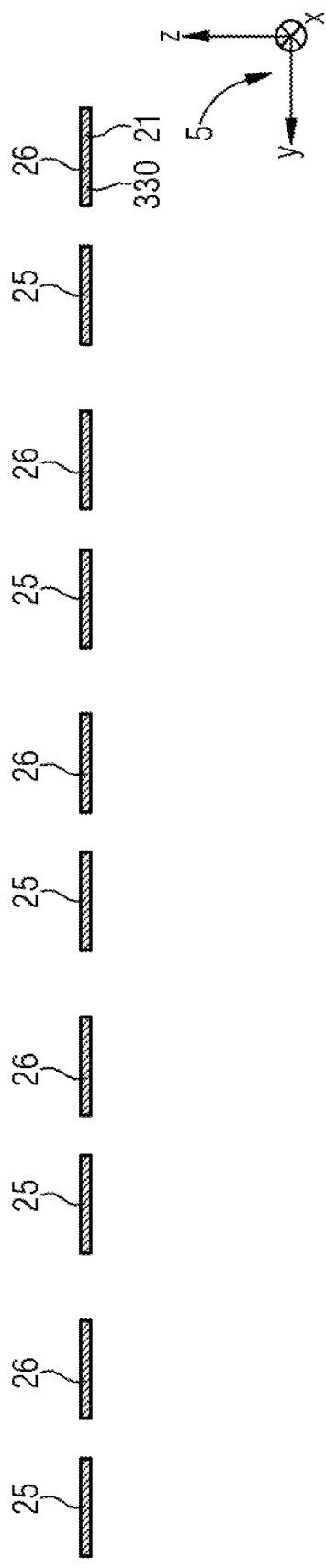
FIG. 5 shows a sectional view through a structured contact layer following a first method step.
Figure 6:
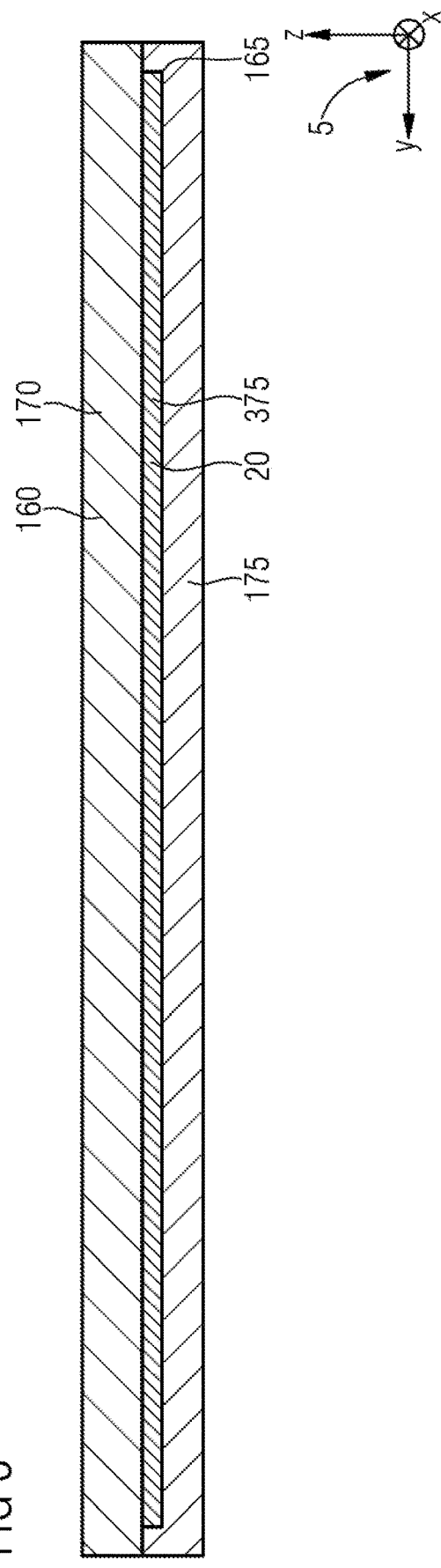
FIG. 6 shows a sectional view through an elastic carrier layer in a mold during a second method step.

FIG. 4 shows a flow diagram of a method for producing the arrangement 10 shown in FIGS. 1 to 3. FIG. 5 shows a sectional view through the structured contact layer 21 following a first method step 200. FIG. 6 shows a sectional view through the elastic carrier layer 20 in a mold 160 during a second method step 205. FIG. 7 shows a sectional view through a composite 190 comprising elastic carrier layer 20 and structured contact layer 21 during a sixth method step 225. FIG. 8 shows a sectional view through the composite 190 during a ninth method step 240. FIG. 9 shows a sectional view through the composite 190 during an eleventh method step 250. FIG. 10 shows a sectional view through the composite 190 during a twelfth method step 255.

The method described in the following method steps serves for simultaneously producing at least one arrangement, preferably a multiplicity of arrangements 10 described in FIGS. 1 to 3. Only the production of the arrangement 10 shown in FIGS. 1 to 3 is discussed hereinafter, however, for reasons of simplicity.

In the first method step 200 (cf. FIG. 5), from a thin film material, preferably a metal film, in particular for example an aluminum film or a gold film or a silver film or a steel film, the geometry of the structured contact layer 21 is cut out from the film material. In this case, a film material is understood to mean sheetlike material having the second layer thickness. The film material may be provided in a rolled-up manner on account of its high flexibility.

The cutting out may be effected by means of a laser cutting method or a stamping method, for example. Other methods are also conceivable for separating the structured contact layer 21 out of the film material. Owing to the use of the film material, the conductive layer 25, 26 is particularly elastic and easily bendable. What is ensured at the same time is that the electrical conductivity of the structured contact layer 21 is ensured by the use of the film material comprising metal. In the embodiment, the structured contact layer 21 comprises a multiplicity of conductive layers 25, 26 spaced apart next to one another in the transverse direction, wherein in each case a pair comprising the first conductive layer 25 and the second conductive layer 26 is provided for in each case one or a plurality of optoelectronic semiconductor components 35 connected in parallel.

In the second method step 205 (cf. FIG. 6), the elastic carrier layer 20 is produced in a compression molding method. For this purpose, a mold 160 (illustrated schematically in FIG. 6) comprising a mold space 165 is provided. The mold 160 may be formed from two mold shells 170, 175, for example, wherein the mold shells 170, 175 delimit the mold space 165 at the top side and the underside. The mold space 165 is closed by the mold shells 170, 175 being pressed against one another.

A first reactant and a second reactant for forming the first material 325 and optionally the first particle material in a mixture, for example, are introduced into the mold space 165. The mold 160 is heated to a predefined first temperature. The first predefined temperature may be 110° C. to 120° C. In a first time interval, for example in a range of 1 to 10 minutes, in particular in a range of 1 to 3 minutes, a first portion of the first and second reactants cures as a result of a crosslinking of the first reactant with the second reactant to form the first material 325. At the end of the first time interval, a second portion of the first and second reactants is still uncrosslinked or only partly crosslinked.

In a third method step 210 following the second method step 205, the first material 325 and the reactants in the mold space 165 may be cooled. In the third method step 210, furthermore, at least one of the two mold shells 170, 175, for example the upper first mold shell 170 shown in FIG. 6, is removed from the partly crosslinked elastic carrier layer 20.

In a fourth method step 215, the structured contact layer 21 produced in the first method step 200 is placed onto the first top side 50 of the partly crosslinked elastic carrier layer 20.

In a fifth method step 220 following the fourth method step 215, the structured contact layer 21 and the elastic carrier layer 20 are pressed together. This may be done for example by the mold 160 being closed again and the structured contact layer 21 being pressed onto the elastic carrier layer 20 with a predefined pressure by way of the upper first mold shell 170.

Alternatively, the partly crosslinked elastic carrier layer 20 may also be removed from the mold 160 and the structured contact layer 21 outside the mold 160 may be placed onto the elastic partly cured carrier layer 20 and be pressed onto the elastic carrier layer 20 with the predefined pressure.

In the sixth method step 225 (cf. FIG. 7), the composite 190 comprising the elastic carrier layer 20 and the structured contact layer 21 is heated for a second predefined time interval, for example 3 hours to 5 hours, to a second predefined temperature, for example 110° C. to 120° C. In this case, the second portion of the previously uncrosslinked or only partly crosslinked first and second reactants are crosslinked to form the first material 325, such that the first and second reactants are completely cured to form the first material 325 at the end of the sixth method step 225. In this case, the second portion of the first material 325 forms the cohesive connection 71 with the conductive layer 25, 26, such that the conductive layer 25, 26 is reliably mechanically connected to the elastic carrier layer 20.

In a seventh method step 230, a first layer 345 of a conductive adhesive is applied to the first conductive layer 25 and a second layer 350 of the conductive adhesive is applied to the second conductive layer 26 in sections in order to form the elastic connecting layer 145, 150. The layer 345, 350 may be applied directly to the second and third top sides 80, 90 of the conductive layer 25, 26 with the contact pad 110, 115.

Alternatively, the layers 345, 350 of the conductive adhesive may also be applied to the respective contact pads 110, 115 of the optoelectronic semiconductor component 35. In this case, the optoelectronic semiconductor component 35 may be oriented such that the contact pad 110, 115 is oriented expediently for applying the layers 345, 350 of the conductive adhesive to the contact pad 110, 115. In this case, the optoelectronic semiconductor component 35 may be oriented for example such that the chip top side 130 of the optoelectronic semiconductor component 35 faces downward and the contact pads 110, 115 arranged at the chip underside are arranged at the top side, such that the layers 345, 350 of the conductive adhesive may be applied to the contact pad 110, 115 from above. Afterward, following the application of the layer 345, 350, the optoelectronic semiconductor component 35 together with the layer 345, 350 may be rotated by 180°, such that the contact pad 110, 115 is then arranged at the underside of the optoelectronic semiconductor component 35.

In an eighth method step 235, the optoelectronic semiconductor component 35 or a multiplicity of optoelectronic semiconductor components 35 in a predefined pattern is positioned on the structured contact layer 21 in such a way that the first contact pad 110 is positioned on the first conductive layer 25 and the second contact pad 115 is positioned at the top side of the second conductive layer 26.

In the ninth method step 240 (cf. FIG. 8), the first layer 345 and the second layer 350 of the conductive adhesive are cured to form the fourth material 340 of the elastic connecting layer 145, 150, such that the optoelectronic semiconductor component 35 is electrically and mechanically connected to the structured contact layer 21 by means of the elastic connecting layer 145, 150.

In a tenth method step 245, by means of a spray coating method or a casting method, for example, the conversion layer 40 is applied to the optoelectronic semiconductor component 35 or the optoelectronic semiconductor components 35 and also to the composite 190 in such a way that the optoelectronic semiconductor component 35 is completely embedded in the conversion layer 40 and the connection region 60 is kept free. It is particularly advantageous here if the structure of the fourth top side 120 is concomitantly formed so as thus to ensure good emission properties of the arrangement 10 for the second electromagnetic radiation into the surroundings.

In an eleventh method step 250 (cf. FIG. 9), the conversion layer 40 is cured.

In an optional twelfth method step 255 (cf. FIG. 10), after the curing of the conversion layer 40, the composite 190 may be divided along predefined cutting lines 195 between two optoelectronic semiconductor components 35 into the individual arrangements 10 shown in FIGS. 1 to 3. The cutting line 195 is arranged at a constriction 140 between two adjacently arranged optoelectronic semiconductor components 35.

In a thirteenth method step 260, the arrangement 10 produced up until then is connected to the textile 15 at the first underside 55 of the elastic carrier layer 20.

The method described in FIG. 4 makes it possible to produce a very flat arrangement 10 which is contactable at the top side via the connection region 60 at the connection pads 85, 95 in a simple manner. If reflection particles are additionally introduced into the elastic carrier layer 20, a particularly good emission behavior of the arrangement 10 may be ensured.

The color particles enable the carrier layer 20 to be adapted to a color of the textile 15 in terms of color.

Figure 11:
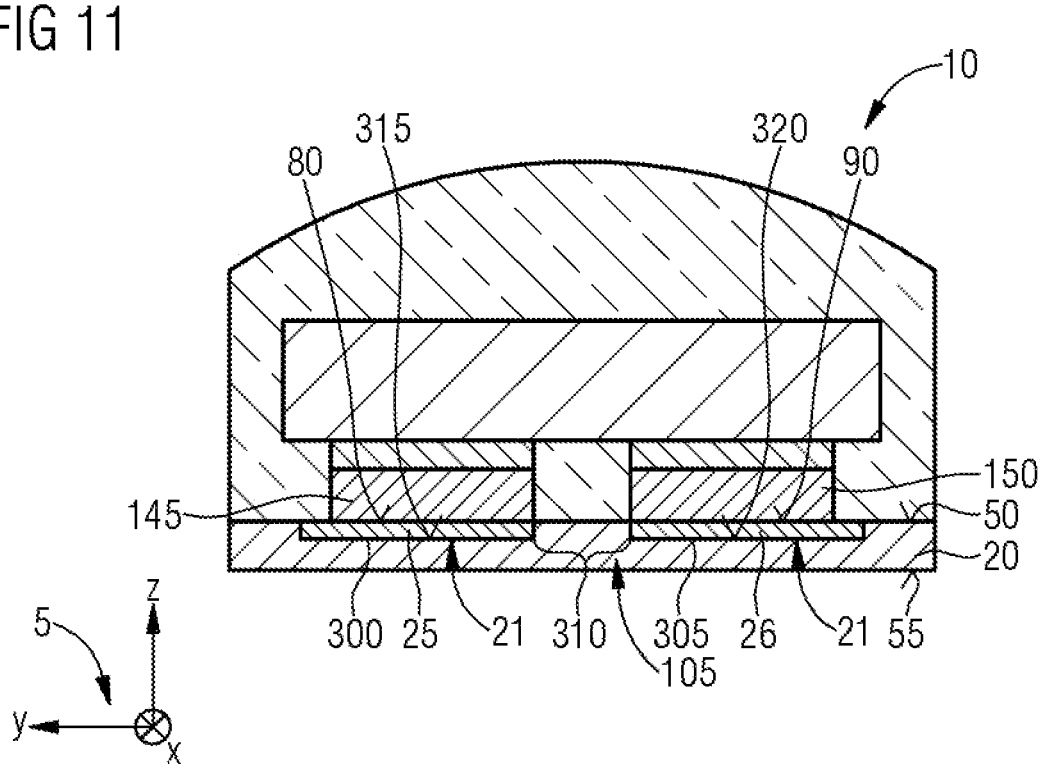
FIG. 11 shows a sectional view along the sectional plane A-A shown in FIG. 1 through an arrangement in accordance with a second embodiment.

FIG. 11 shows a sectional view along the sectional plane A-A shown in FIG. 1 through an arrangement 10 in accordance with a second embodiment.

The arrangement 10 is formed substantially identically to the arrangement 10 explained in FIGS. 1 to 3. Exclusively the differences between the arrangement 10 shown in FIG. 11 and the arrangement 10 explained in FIGS. 1 to 3 shall be explained below.

The elastic carrier layer 20 comprises a first cavity 300 and a second cavity 305 at the first top side 50. The first conductive layer 25 is arranged in the first cavity 300 and the second conductive layer 26 is arranged in the second cavity 305. The first cavity 300 and the second cavity 305 are for example formed identically and arranged offset with respect to one another in the transverse direction. Between the first cavity 300 and the second cavity 305, a web 310 is provided in the interspace 105. The web 310 separates the first cavity 300 from the second cavity 305. The cavities 300, 305 are open at the top side. At the underside each of the cavities 300, 305 is delimited by a cavity base 315, 320, such that the first material 325 is arranged between the cavity 300, 305 and the first underside 55 and the cavity 300, 305 is sealed fluidically with respect to the first underside 55 of the elastic carrier layer 20.

The cavity 300, 305 is formed in a grooved fashion, for example, but an extent in the transverse direction (y-direction) is greater than a height (z-direction) of the cavity 300, 305. In the embodiment, for example, the first cavity 300 is completely filled with the second material 330 of the first conductive layer 25. Likewise, the second cavity 305 is filled with a second material 330 of the second conductive layer 26. The structured contact layer 21 comprises a second layer thickness of 10 μm to 100 μm. This may correspond to the height of the cavity 300, 305. Moreover, the cavity 300, 305 may be only partly filled with the second material 330 of the conductive layer 25, 26. Utilizing a maximum volume of the cavity 300, 305 ensures that the second and third top sides 80, 90 firstly are arranged in a common plane with respect to one another and secondly are also arranged in a common plane with the first top side 50 of the elastic carrier layer 20. As a result, the arrangement 10 may be formed in a particularly flat fashion.

Furthermore, it is advantageous if the structured contact layer 21 comprises at least one fourth carrier matrix comprising at least one of the following second materials 330: elastic plastic, silicone, LRI silicone (LRI=low refractive index), HRI silicone (HRI=high refractive index), epoxy resin, electrically conductive polymer.

In addition, the second material 330 may comprise at least one of the following third particle materials: silver, gold, copper, nickel, graphite, tin, iron, aluminum. The second particle material is embedded in the fourth carrier matrix and, in the case of an electrically nonconductive fourth carrier matrix, ensures that the structured contact layer 21 is electrically conductive.

On the elastic carrier layer 20, as explained in FIGS. 1 to 3, the optoelectronic semiconductor component 35 is secured on the conductive layer 25, 26 by means of the elastic connecting layer 145, 150. Likewise, the conductive layer 25, 26 arranged in the cavity 300, 305 is also completely covered by the conversion layer 40 in the radiation region 65.

Figure 12:
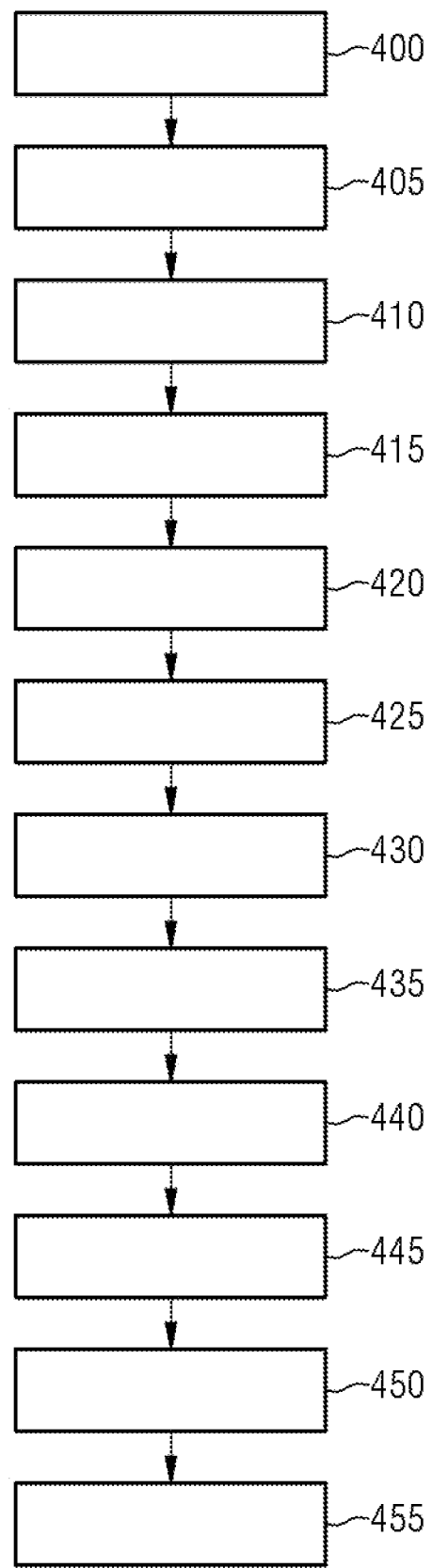
FIG. 12 shows a flow diagram of a method in accordance with a second embodiment for producing the arrangement shown in FIG. 10.
Figure 16:
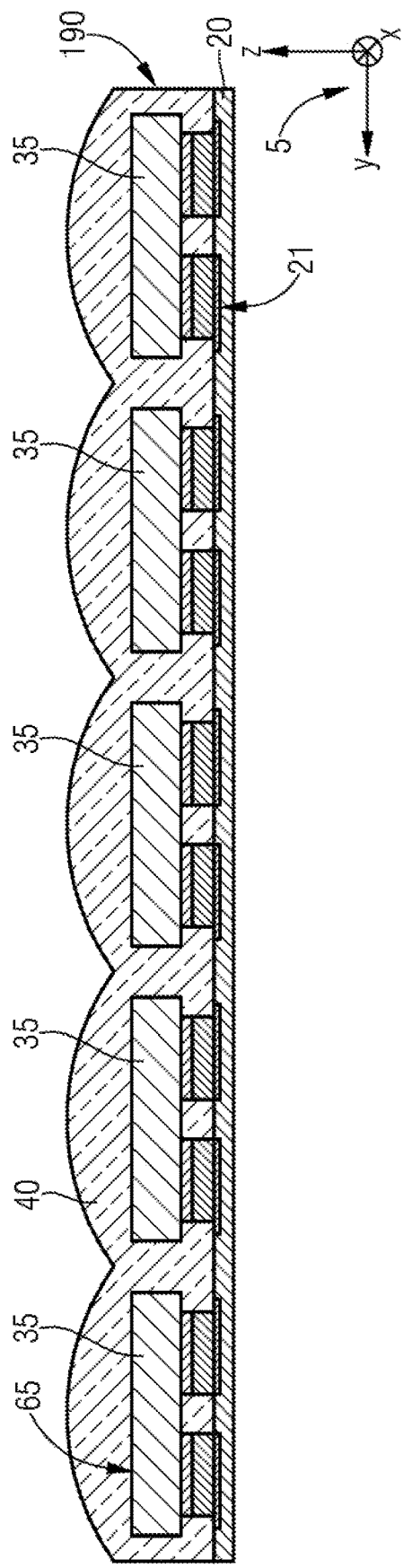
FIG. 16 shows a sectional view through the composite following a ninth method step.

FIG. 12 shows a flow diagram of a method in accordance with a second embodiment for producing the arrangement 10 shown in FIG. 10. FIG. 13 shows a sectional view through the elastic carrier layer 20 and the mold 160 during a second method step 405. FIG. 14 shows a sectional view through the elastic carrier layer 20 during a fifth method step 420. FIG. 15 shows a sectional view through a composite 190 following a seventh method step 430. FIG. 16 shows a sectional view through the composite 190 following a ninth method step 440.

Figure 17:
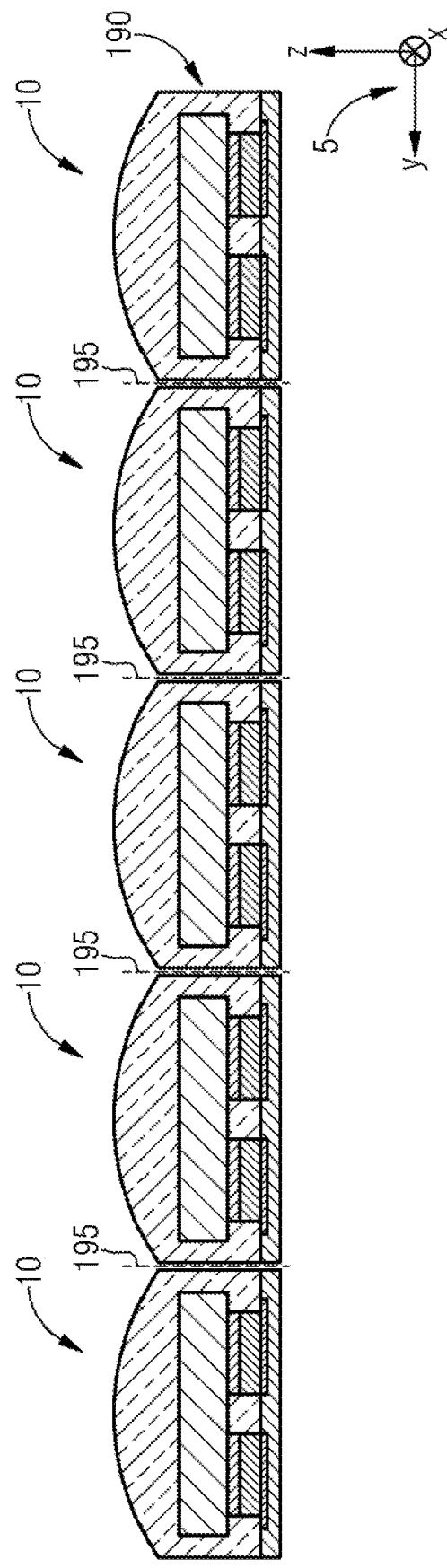
FIG. 17 shows a sectional view through the composite during an eleventh method step.

FIG. 17 shows a sectional view through the composite 190 during an eleventh method step 450.

The method is very similar to the method explained in FIG. 4. However, the entire method will be discussed for the sake of improved understanding.

In a first method step 400, the mold 160 is provided. The mold 160 is formed substantially identically to the mold 160 shown in FIG. 6, but instead of the planar configuration of the first mold shell 170 on the inside as shown in FIG. 6, the first mold shell 170 is formed in a structured fashion on the inside and comprises for example at least one first protuberance 180, formed in a manner corresponding to the geometry of the first cavity 300, and one second protuberance 181, formed in a manner corresponding to the geometry of the second cavity 305. Preferably, a plurality of first and second protuberances 180, 181 are provided.

The second mold shell 175, which is arranged at the underside with respect to the first mold shell 170, together with the first mold shell 170 delimits the mold space 165. The protuberances 180, 181 are formed identically to one another, for example, and comprise a rectangular cross section. The protuberances 180, 181 extend in the direction of the second mold shell 175. The protuberances 180, 181 are arranged at a regular distance from one another. Between the protuberances 180, 181, provision is made of a respective depression 185 in the first upper mold shell 170, which separates the protuberances 180, 181 from one another in the transverse direction. The second mold shell 175 is formed in a planar fashion at the top side. The protuberance 180, 181 serves for shaping the cavity 300, 305 and the depression 185 serves for shaping the web 310.

In the second method step 405 (cf. FIG. 13), the elastic carrier layer 20 is produced in a compression molding method. The second method step 405 substantially corresponds to the second method step 205 explained above. In this case, the first and second reactants for forming the first material 325 and optionally the first particle material are introduced into the mold space 165. In the first time interval, for example in a range of 1 to 10 minutes, in particular in a range of 1 to 3 minutes, the two reactants are partly cured. For this purpose, the mold 160 is heated to the predefined first temperature. In the first time interval the first portion of the reactants crosslinks to form the first material and assumes the predefined configuration of the mold 160 with the cavities 300, 305 and maintains the configuration of the elastic carrier layer 20 even though the second portion of reactants is still uncrosslinked or only partly crosslinked at the end of the first time interval.

In a third method step 410, at least the first upper mold shell 170 is removed from the second lower mold shell 175. Alternatively, the elastic carrier layer 20 may be completely removed from the mold 160.

In a fourth method step 415, the cavities 300, 305 are filled with a third and a fourth reactant for forming the second material 330 of the conductive layer 25, 26. This may be done for example by a mixture of the third and fourth reactants being introduced into the cavity 300, 305 by means of a dispensing method or screen printing in such a way that a maximum volume of the cavity 300, 305 is not exceeded. It is particularly advantageous if the first reactant and the third reactant and also the second reactant and the fourth reactant are identical.

In the fifth method step 420 (cf. FIG. 14), the partly cured elastic carrier layer 20 and the filled cavities 300, 305 are heated for a second predefined time interval, for example 3 hours to 5 hours, to the second predefined temperature, for example 110° C. to 120° C. In this case, the second portion of the previously uncrosslinked or only partly crosslinked first and second reactants is crosslinked to form the first material 325. Furthermore, the third and fourth reactants are crosslinked to form the second material, such that at the end of the fifth method step 420 the first and second reactants are completely cured to form the first material 325 and the third and fourth reactants are completely cured to form the second material 330. In this case, the second portion of the first material 325 forms the cohesive connection 71 with the third and fourth reactants, such that the conductive layer 25, 26 is reliably mechanically connected to the elastic carrier layer 20.

In a sixth method step 425, which is identical to the seventh method step 230 explained in FIG. 4, the conductive adhesive is applied to the structured contact layer 21 in order to form the elastic connecting layer 145, 150. In this case, for example, the conductive adhesive is applied to the second and third top sides 80, 90 of the conductive layer 25, 26 in a region that overlaps the contact pad 110, 115. Alternatively, the conductive adhesive may also be applied to the contact pads 110, 115 of the optoelectronic semiconductor component 35.

In a seventh method step 430 (cf. FIG. 15), which is identical to the eighth method step 235 explained in FIG. 4, the optoelectronic semiconductor component 35 is positioned on the structured contact layer 21 in such a way that the first contact pad 110 is positioned on the first conductive layer 25 and the second contact pad 115 is positioned at the top side of the second conductive layer 26.

In the eighth method step 435, which is identical to the ninth method step 240 explained in FIG. 4, the conductive adhesive is cured in order to form the fourth material 340, such that the optoelectronic semiconductor component 35 is electrically and mechanically connected to the structured contact layer 21 by way of the elastic connecting layer 145, 150.

In a ninth method step 440, which is identical to the tenth method step 245 explained in FIG. 4 (cf. FIG. 16), by means of spray coating or dispensing, for example, the conversion layer 40 is applied on the elastic carrier layer 20, the conductive layer 25, 26 and the optoelectronic semiconductor component 35 in such a way that in the radiation region 65 the optoelectronic semiconductor component 35 is completely embedded in the conversion layer 40. What is essential here is that no second carrier matrix of the conversion layer 40 is applied in the connection region 60, such that the connection region 60 is exposed at the top side and a reliable contacting via the connection pad 85, 95 is thus ensured.

In a tenth method step 445, the conversion layer 40 is cured.

In an eleventh method step 450 (cf. FIG. 17), following the curing of the conversion layer 40, the composite 190 may be divided along the predefined cutting lines 195, for example between two optoelectronic semiconductor components 35, into the individual arrangements 10 shown in FIG. 11.

In a twelfth method step 455, the arrangement 10 produced up until then is connected to the textile 15 at the elastic carrier layer 20.

As an alternative to the method described in FIG. 12, it is also conceivable for the first material 325 of the elastic carrier layer 20 to be completely cured in the third method step 410. Furthermore, following the curing of the elastic carrier layer 20, the elastic carrier layer 20 may be removed from the mold 160. Alternatively, however, it is also possible for only the first upper mold shell 170 to be removed and for the third and fourth reactants for forming the conductive layer 25, 26 to be introduced into the cavities 300, 305 onto the first top side 50 of the elastic carrier layer 20. In this case, the conductive layer 25, 26 and the elastic carrier layer 20 are cured temporally successively rather than, as explained above, at least partly in parallel temporally.

Furthermore, the sixth and eighth method steps 425, 435 may also be dispensed with and the seventh method step 430 may be carried out temporally between the fourth method step 415 and the fifth method step 420. In addition, the contact pad 110, 115 is brought into touching contact with the third and fourth reactants, such that following the curing of the third and fourth reactants to form the second material 330, the conductive layer 25, 26 directly secures the optoelectronic semiconductor component 35. The elastic connecting layer 145, 150 is dispensed with in this case.

Figure 18:
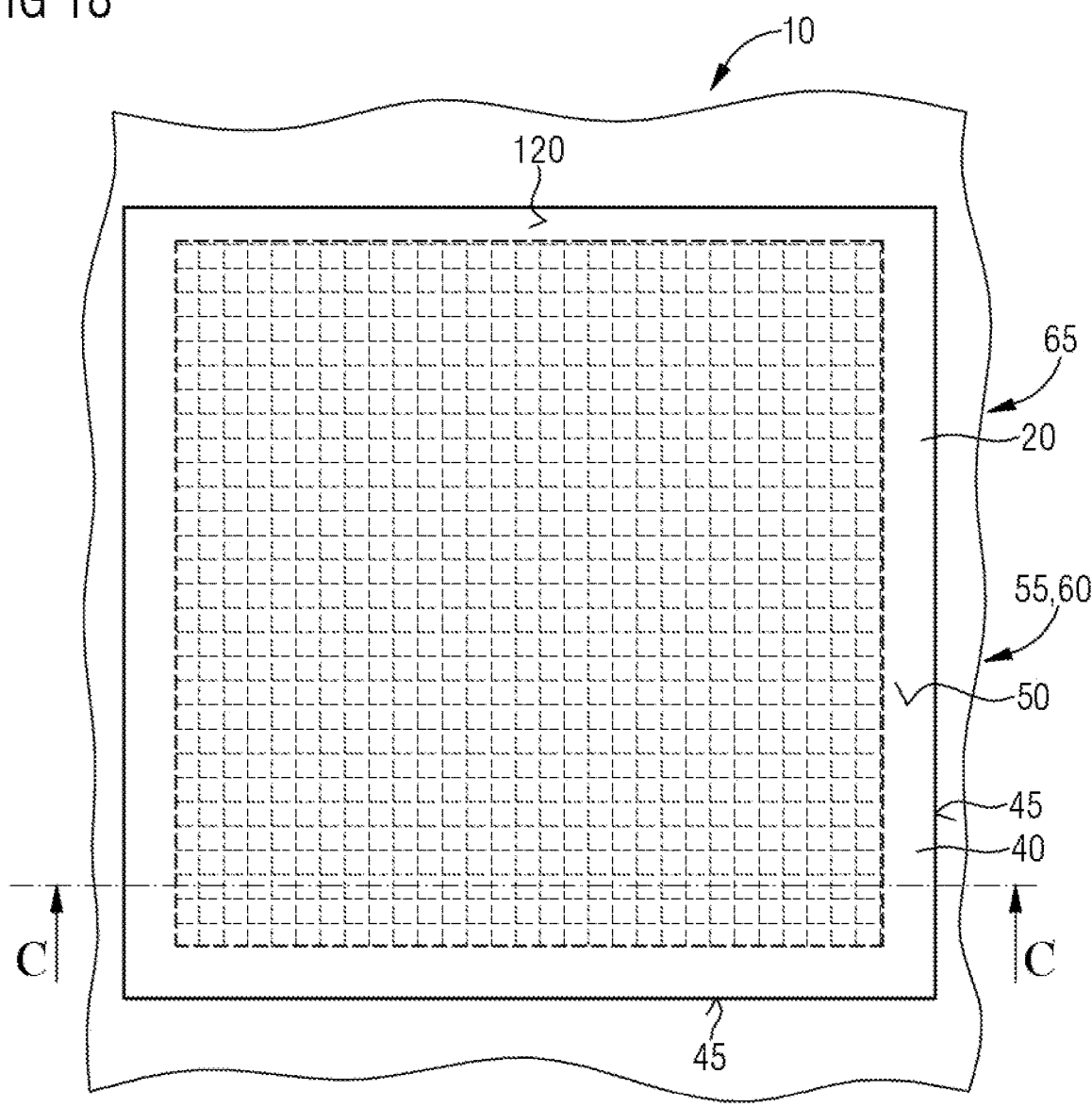
FIG. 18 shows a plan view of an arrangement in accordance with a third embodiment.

FIG. 18 shows a plan view of an arrangement 10 in accordance with a third embodiment.

The arrangement 10 is formed substantially identically to the configurations of the arrangement 10 explained in FIGS. 1 to 3 and 11. Exclusively the deviations between the arrangement 10 shown in FIG. 18 and the arrangements 10 shown in FIGS. 1 to 3 and 11 are discussed hereinafter.

Although the arrangement 10 comprises the connection region 60 and the radiation region 65, the radiation region 65 is however arranged at the top side of the elastic carrier layer 20. In this case, the conversion layer 40 completely covers the first top side 50 of the elastic carrier layer 20. The connection region 60 is arranged at the first underside 55 at the rear side and is hidden by the conversion layer 40 and the elastic carrier layer 20 in FIG. 18. In the embodiment, the conversion layer 40 extends as far as the side faces 45 of the elastic carrier layer 20. Alternatively, it is also conceivable for the conversion layer 40 to leave an edge region of the carrier layer 20 uncovered at the top side, such that the edge region is free at the top side.

In the embodiment, the textile 15 is secured to the elastic carrier layer 20. Alternatively, the textile 15, particularly in the case of a semitransparent or transparent configuration of the textile 15, may also be arranged at the top side on the fourth top side 120 of the conversion layer 40.

Figure 19:
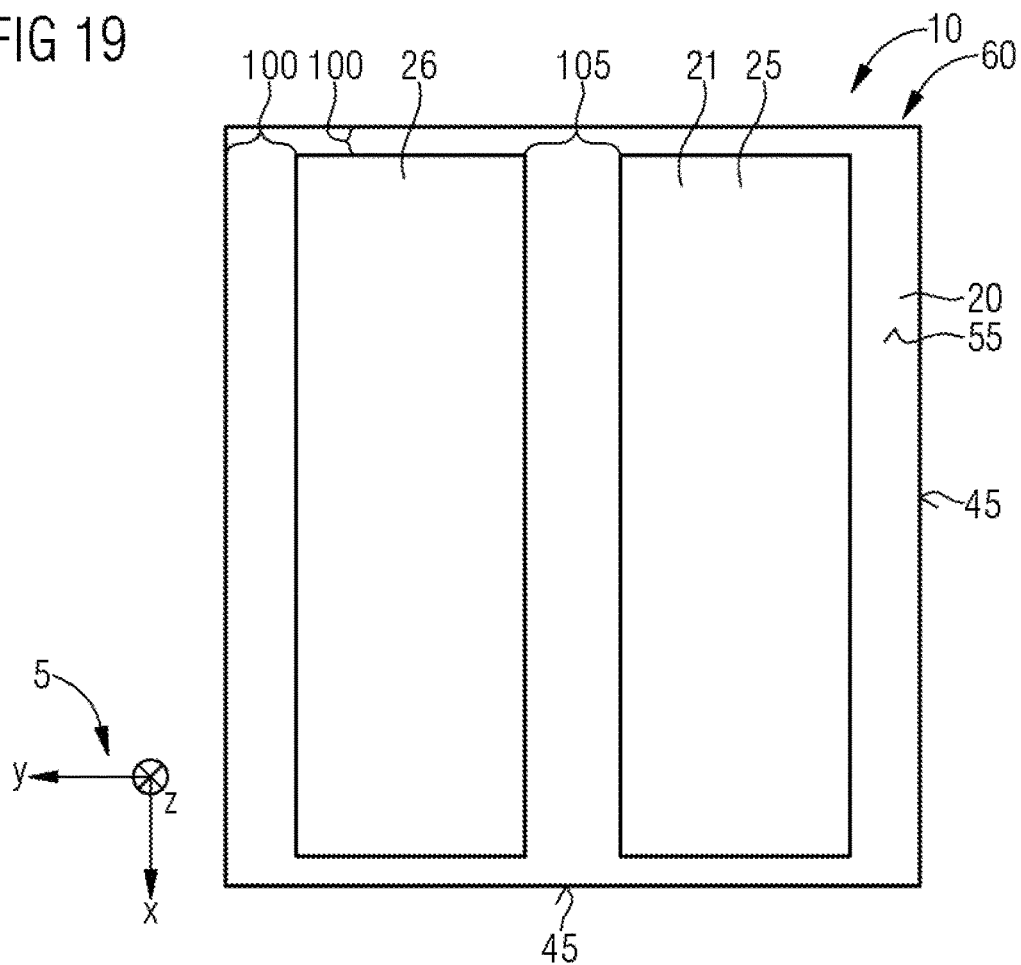
FIG. 19 shows a bottom view of the arrangement shown in FIG. 18.

FIG. 19 shows a bottom view of the arrangement 10 shown in FIG. 18.

As already explained in FIG. 18, the connection region 60 is arranged at the first underside 55. In this case, the conductive layers 25, 26 extend over a large part of the entire area at the underside. In this case, the interspace 105 is provided between the first conductive layer 25 and the second conductive layer 26, by way of which interspace the elastic carrier layer 20 electrically insulates the first conductive layer 25 from the second conductive layer 26. The interspace 105 is not covered at the underside, that is to say that at the elastic carrier layer 20 at the underside no structured contact layer 21 is applied to the first underside 55. Furthermore, at the elastic carrier layer 20 no conversion layer 40 is arranged at the underside.

In the embodiment, at the conductive layers 25, 26 the edge region 100 is in each case provided laterally with respect to the side faces 45. It goes without saying that also at least at one side the conductive layer 25, 26 may extend as far as the side face 45 and end at the side face 45. The arrangement of the contact pads 110, 115 at a distance from the side face 45, and thus the provision of the edge region 100, prevents corrosive media, in particular perspiration or other liquids, for example, from being able to penetrate laterally between the conductive layer 25, 26 and the elastic carrier layer 20.

In addition, after an electrical contact has been applied to the conductive layer 25, 26, the arrangement 10 may be sealed at the underside.

Figure 20:
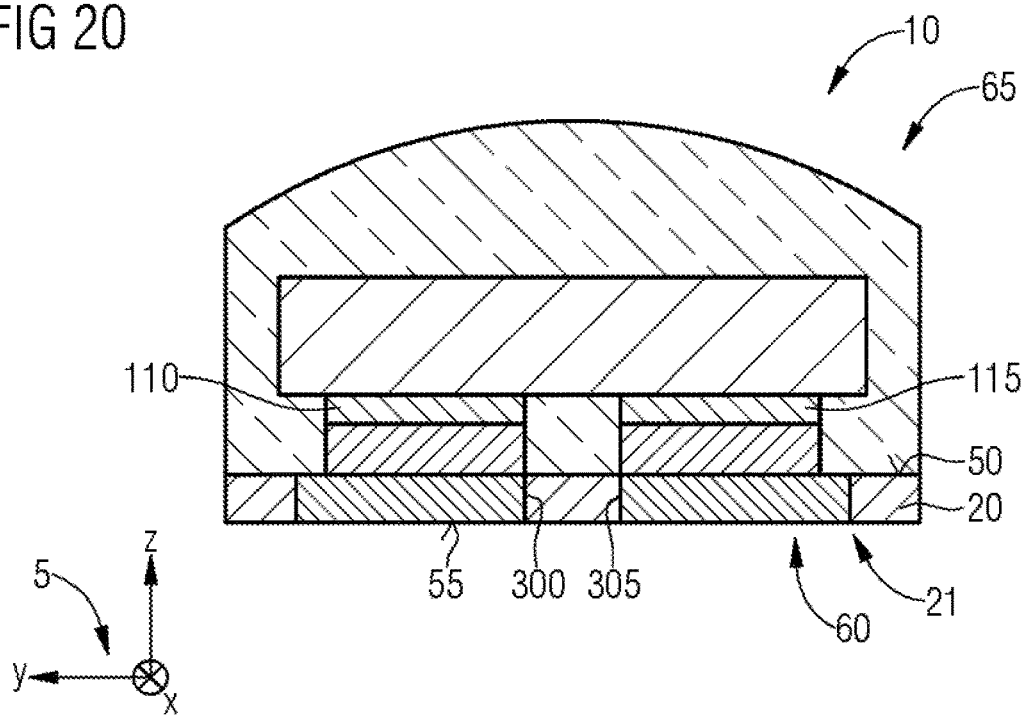
FIG. 20 shows a sectional view along a sectional plane C-C shown in FIG. 18 through the arrangement shown in FIG. 18.

FIG. 20 shows a sectional view along a sectional plane C-C shown in FIG. 18 through the arrangement 10 shown in FIG. 18.

In a departure from the configuration of the arrangement 10 shown in FIG. 12, the cavity 300, 305 is formed as a through opening in the elastic carrier layer 20, such that the cavity 300, 305 is open toward the first underside 55 of the elastic carrier layer 20. This configuration has the advantage that the conductive layer 25, 26 may be contacted from the first underside 55, such that in the transverse and longitudinal directions as a result of the arrangement of the contact pads 110, 115 at the rear side in relation to the extent in the longitudinal direction and the transverse direction, a particularly large radiation region 65 may be provided.

In the embodiment, the cavity 300, 305 comprises a substantially rectangular cross section and extends from the first top side 50 completely through the elastic carrier layer 20. It goes without saying that it would also be conceivable for the cavity 300, 305 to comprise a different cross section. In particular, it is conceivable for the cross section of the cavity 300, 305 to change and to increase or decrease, for example, between the first underside 55 and the first top side 50. Moreover, a stepped configuration of the cavity 300, 305 is conceivable. Moreover, the cavity 300, 305 may comprise an undercut. This configuration has the advantage that the structured contact layer 21 is secured particularly well in the cavity 300, 305 and the conductive layer 25, 26 is prevented from being removed from the cavity 300, 305 at the top side or underside by an additional positively locking engagement. Furthermore, an area for forming the cohesive connection 71 between the structured contact layer 21 and the elastic carrier layer 20 is enlarged by comparison with the configuration shown in FIG. 20, such that the conductive layer 25, 26 is connected to the elastic carrier layer 20 particularly well.

As a result of the cavities 300, 305 being provided as a through opening in the elastic carrier layer 20, the structured contact layer 21 may comprise a particularly high cross section (in a yz-plane) and be formed with a particularly high current-carrying capacity as a result. As a result, even optoelectronic semiconductor components 35 having a particularly high energy demand for electrical energy may be arranged on the conductive layer 25, 26 at the top side. The structured contact layer 21 comprises a second layer thickness of 30 μm to 200 μm. This may correspond to the height of the elastic carrier layer 20.

Figure 21:
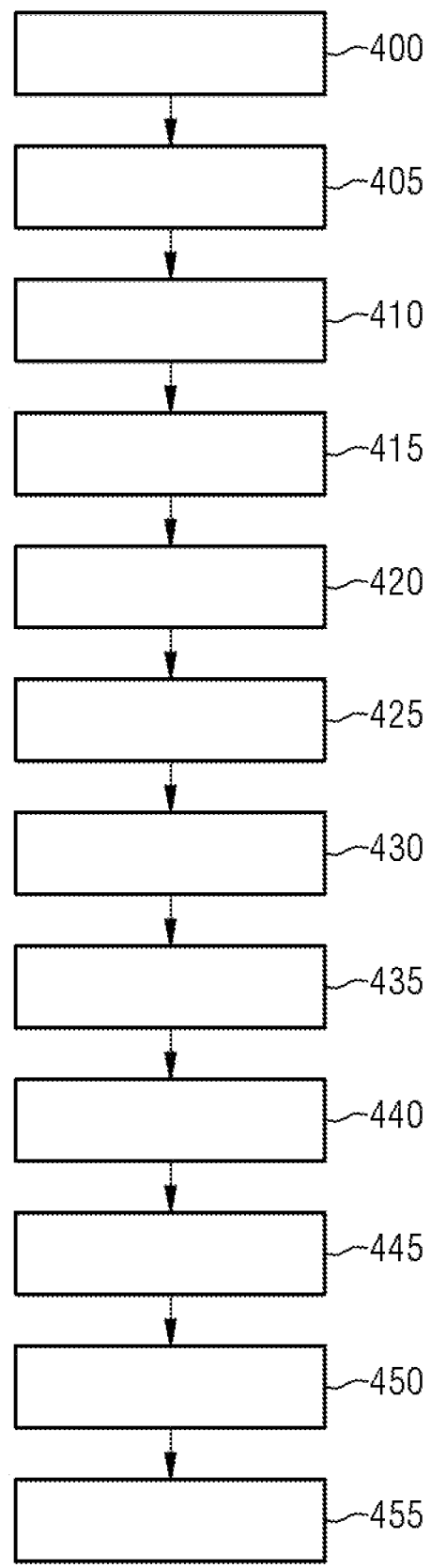
FIG. 21 shows a flow diagram of a method for producing the arrangement shown in FIGS. 18 to 20.
Figure 22:
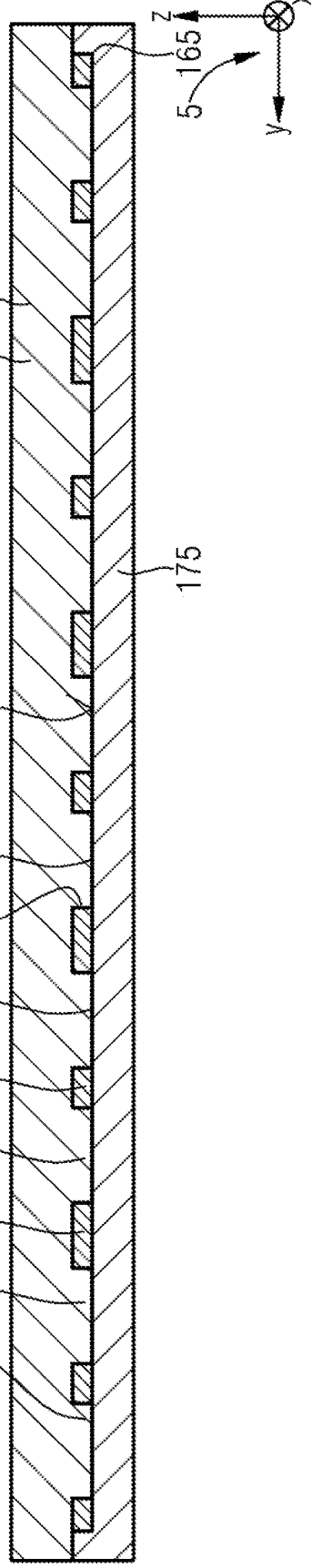
FIG. 22 shows a sectional view through the elastic carrier layer and the mold during the second method step.
Figure 23:
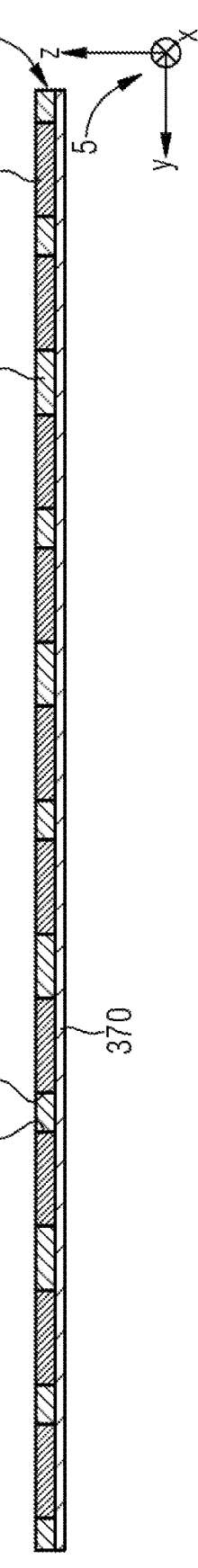
FIG. 23 shows a sectional view through the elastic carrier layer following the fourth method step.
Figure 24:
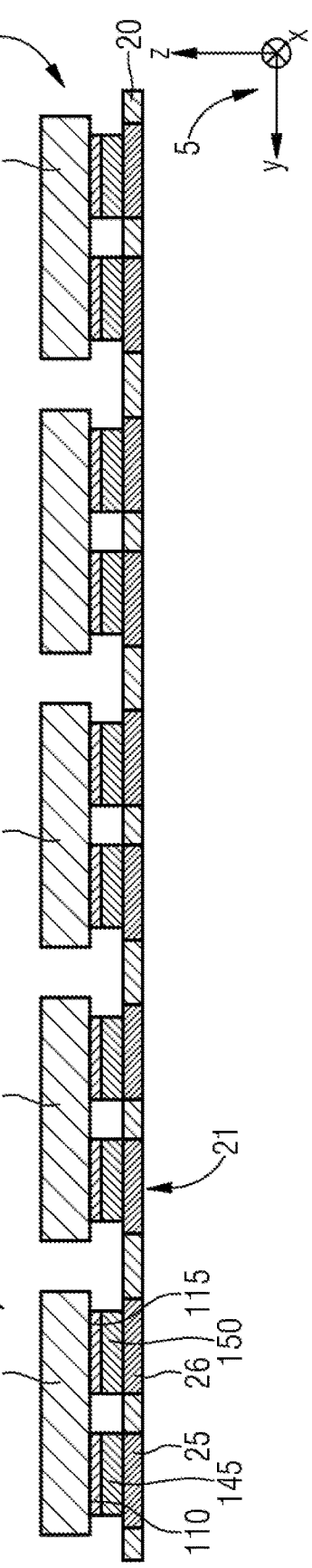
FIG. 24 shows a sectional view through the composite following the seventh method step.
Figure 25:
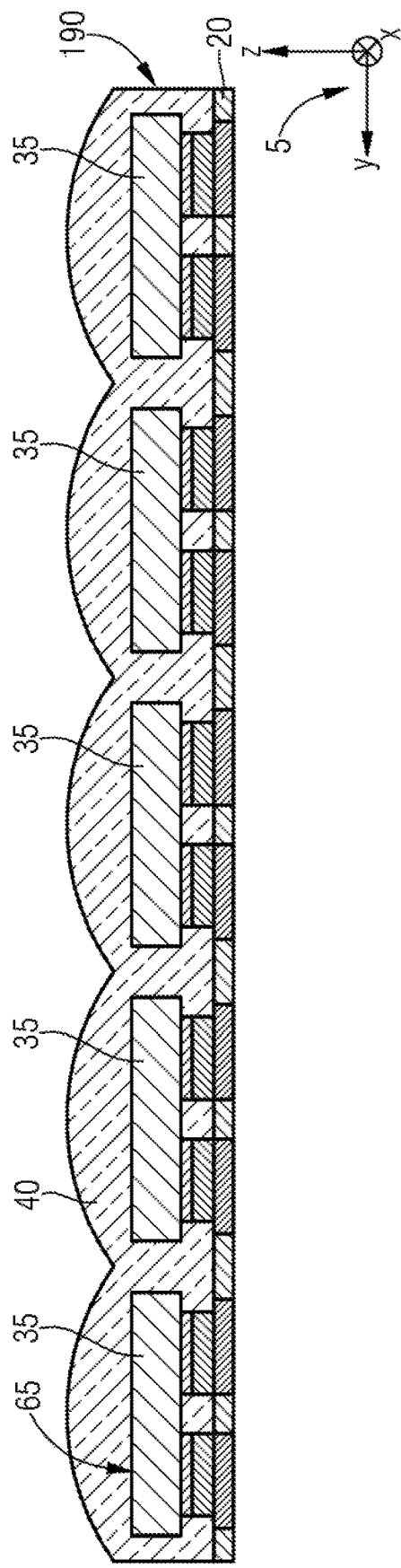
FIG. 25 shows a sectional view through the composite following the ninth method step.
Figure 26:
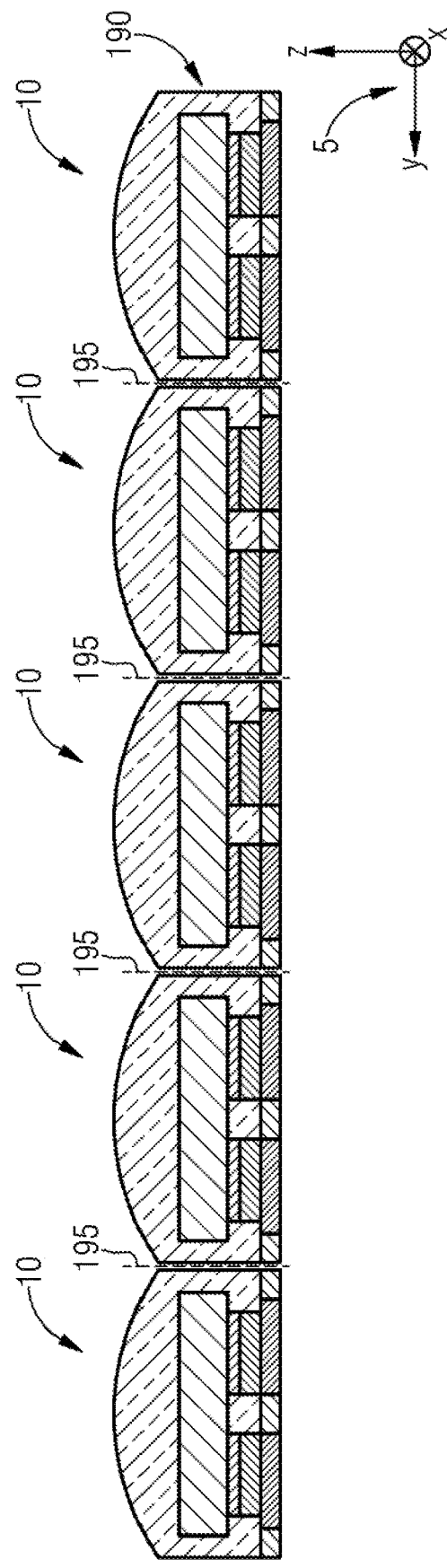
FIG. 26 shows a sectional view through the composite during the eleventh method step.

FIG. 21 shows a flow diagram of a method for producing the arrangement shown in FIGS. 18 to 20. FIG. 22 shows a sectional view through the elastic carrier layer 20 and the mold 160 during the second method step 405. FIG. 23 shows a sectional view through the elastic carrier layer 20 following the fourth method step 415. FIG. 24 shows a sectional view through the composite 190 following the seventh method step 430. FIG. 25 shows a sectional view through the composite 190 following the ninth method step 440. FIG. 26 shows a sectional view through the composite 190 during the eleventh method step 450.

The method explained in FIG. 21 substantially corresponds to the method explained in FIG. 12, such that exclusively the differences between the method explained in FIG. 21 and the method explained in FIG. 12 shall be discussed.

In the first method step 400, as explained in FIGS. 12 and 13, the mold 160 is provided. In addition, a thermally stable protective film 370 is arranged on a mold top side 366 of the second lower mold shell 175. The thermally stable protective film 370 comprises a glass transition temperature or a melting point that is greater than the predefined first temperature of the heated mold 160.

The protuberance 180, 181 of the first mold shell 170 extends in the direction of the second mold shell 175 to an extent such that the protuberance underside 375 of the protuberance 180, 181 is seated on the protective film 370 at the top side.

It goes without saying that the protective film 370 may also be dispensed with. In particular, the protective film 370 may be dispensed with if a parting agent is introduced into the mold space 165 before the first and second reactants are introduced, said parting agent bearing against the surfaces, in particular the mold top side 366, of the mold shells 170, 175 delimiting the mold space 165. Reliable removal of the elastic carrier layer 20 from the mold space 165 may be ensured as a result. The parting agent may be sprayed on thinly, for example. This makes it possible to avoid any influencing of the geometry of the elastic carrier layer 20 by the thin-walled parting agent. In this case, the protuberance underside 375 bears on the lower second mold shell 175 at the top side. As a result of the downwardly open protuberances 180, 181 being seated on the mold top side 366, the cavities 300, 305 are formed in the elastic carrier layer 20.

The elastic carrier layer 20 may be produced by means of the compression molding method, for example, in the second and third method steps 405, 410 explained in FIG. 12 (cf. FIG. 22). Alternatively, it would also be conceivable for a transfer molding method to be carried out instead of the compression molding method for producing the elastic carrier layer 20. In this case, instead of the first reactant and the second reactant being mixed in a mixing cannula or in the mold space 165 as in the case of compression molding, for example, they are mixed in a separate space. In this case, the first reactant and the second reactant begin crosslinking in the space. The first reactant and the second reactant are introduced into the mold space 165 in a partly crosslinked state, but in a liquid (or viscous) state, wherein the first and second reactants crosslink further in the mold space 165 as described above.

In the third method step 410, the first upper mold shell 170 is removed from the second lower mold shell 175. The partly cured elastic carrier layer 20 remains on the protective film 370. The second lower mold shell 175 may be removed from the protective film 370. Alternatively, the partly cured elastic carrier layer 20 with the protective film 370 may remain in the second mold shell 175.

In the fourth method step 415 (cf. FIG. 23), the cavities 300, 305 are filled with the third and fourth reactants for forming the second material 330 of the conductive layer 25, 26. In this case, at the underside, the protective film 370 delimits the cavity 300, 305 and prevents the third and fourth reactants from escaping from the cavity 300, 305.

Afterward, the fifth to seventh method steps 420 to 430 described in FIG. 12 are carried out, wherein the protective film 370 is additionally removed at the underside in the sixth or seventh method step 425, 430 (cf. FIG. 24).

The ninth and tenth method steps 440, 445 (cf. FIG. 25) are carried out as described in FIG. 12, wherein in the tenth method step 445 it is ensured that during the spray coating or dispensing of the conversion layer 40, the conversion layer 40 does not cover and contaminate the first underside 55.

The eleventh and twelfth method steps 450, 455 (cf. FIG. 26) are carried out as explained in FIG. 12.

The described configuration of the arrangement 10 has the advantage that the arrangement 10 is formed in a very flat fashion as a result of the integration of the structured contact layer 21 into the elastic carrier layer 20. Moreover, by virtue of the fact that the cavities 300, 305 are formed as through openings in the elastic carrier layer 20, contacting of the arrangement 10 from the rear side, that is to say on a side facing away from the optoelectronic semiconductor component 35, may be ensured.

The arrangement 10 described in FIGS. 1 to 25 comprises a high mechanical deformability and bendability. This is ensured primarily by the elastic carrier layer 20, but also the elastic connecting layer 145, 150. Furthermore, in the event of the bending of the arrangement 10, destruction of the arrangement 10 is avoided by virtue of the elastic configuration of the structured contact layer 21.

The configurations described above furthermore comprise the advantage that they are producible particularly cost-effectively since the provision of separate stiff circuit boards may be dispensed with. Furthermore, new applications are opened up since the arrangements 10 described above are particularly flexible.

Figure 27:
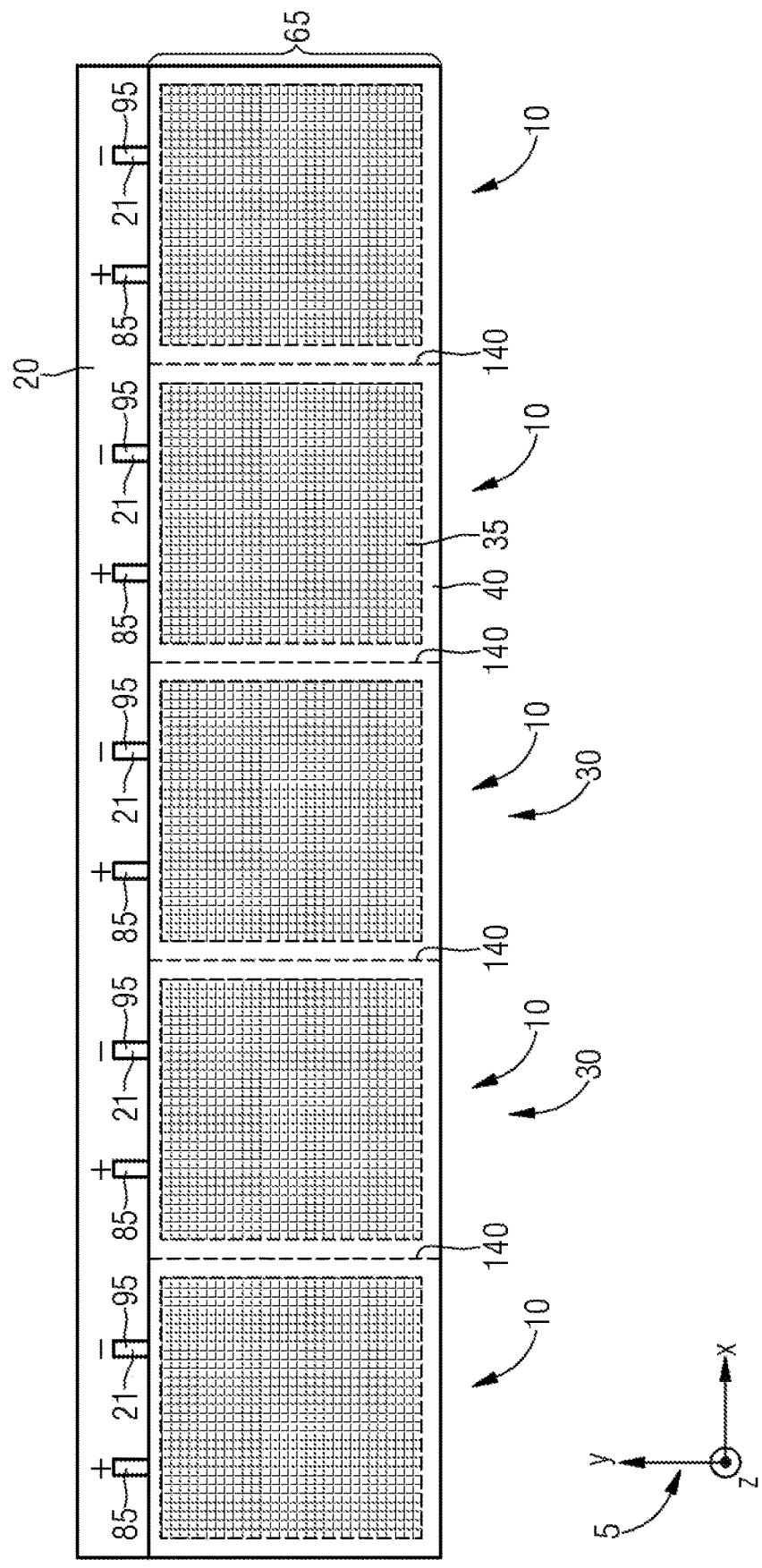
FIG. 27 shows a plan view of an array in accordance with a first embodiment.

FIG. 27 shows a plan view of an array 30 in accordance with a first embodiment.

In the embodiment, the array 30 comprises a plurality of arrangements 10 explained in FIGS. 1 to 26 that are arranged next to one another. The elastic carrier layers 20 of the arrangements 10 are formed in each case integrally and material-uniformly. The elastic carrier layers 20 of the arrangements 10 are formed in a continuous fashion, such that the elastic carrier layer 20 and the conversion layer 40 between the optoelectronic semiconductor components 35 are free of interruptions. In the embodiment, the array 30 comprises five optoelectronic semiconductor components 35 arranged in a row in a manner spaced apart at a regular distance from one another. Besides the regular spacing shown in FIG. 27, a distance between the optoelectronic semiconductor components 35 may also comprise an irregular distance. In particular, an irregular distance is conceivable if the distance is adapted to a geometry of the textile 15.

Just like the elastic carrier layer 20, the conversion layer 40 is formed in a continuous fashion. The conversion layers 40 are formed integrally and material-uniformly. The conversion layer 40 is formed at the top side in such a way that the conversion layer 40 in each case between adjacent optoelectronic semiconductor components 35 comprises the constriction 140, which ends for instance at the level of the chip top side 130 in the z-direction. The constriction 140 ensures that the arrangement 10 is bendable particularly well. In this case, the constriction 140 is preferably provided on both sides of a respective optoelectronic semiconductor component 35 in order thus to ensure a particularly narrow bending radius of the array 30 and to configure the arrangement 10 particularly flexibly as a result. In this case, the spaced-apart optoelectronic semiconductor components 35 ensure that, in the event of bending of the array 30, the optoelectronic semiconductor components 35 do not butt against one another and, if appropriate, the arrangements 10 are not delaminated or destroyed.

Each of the structured contact layers 21 of the arrangements 10 comprises the connection pad 85, 95 in the connection region 60, such that each of the connection pads 85, 95 of the conductive layers 25, 26 is separately contactable in order to connect the conductive layer 25, 26 to the driver circuit or the arrangement 10 to the electrical energy source. As a result, each of the optoelectronic semiconductor components 35 may be driven, for example activated or deactivated, separately.

FIG. 28 shows a plan view of an array 30 in accordance with a second embodiment.

The array 30 is formed substantially identically to the array 30 shown in FIG. 27. In a departure therefrom, the array comprises a first edge region 380 and a second edge region 385. The first edge region 380 is adjacent to the conversion layer 40 at a first side in the y-direction. The second edge region 385 is arranged on a second side of the conversion layer 40 located opposite the first edge region 380. The first edge region 380 and the second edge region 385 extend in each case between the conversion layer 40 and the side face 45 of the elastic carrier layer 20.

The first edge region 380 is arranged parallel to the second edge region 385. A main direction of extent of the edge region 380, 385 extends in the x-direction. The edge region 380, 385 is formed such that it is narrower in the y-direction than in the x-direction. In the first and second edge regions 380, 385, the elastic carrier layer 20 is not covered by the conversion layer 40 at the top side, such that the first top side 50 of the elastic carrier layer 20 is exposed. The connection region 60 is provided at a side of the array 30 in the x-direction. The first and second edge regions 380, 385 adjoin the connection region 60, such that the connection region 60 and the two edge regions 380, 385 together comprise a U-shaped configuration. Likewise, as already explained in FIGS. 1 to 20, the connection region 60 is free at the top side and thus also not covered by the conversion layer 40. On a side located opposite the connection region 60 in x-direction, the conversion layer 40 adjoins the side face 45.

The structured contact layer 21 comprises a first connecting section 390 and a second connecting section 395, wherein the first connecting section 390 and the second connecting section 395 extend parallel to one another in the x-direction. The first connecting section 390 connects the respective first conductive layers 25 of the structured contact layer 21, which are oriented perpendicular to the first connecting section 390, to one another and to the first connection pad 85.

The second connecting section 395 in each case connects the second conductive layers 26 of the respective arrangements 10 to the second connection pad 95. By virtue of the fact that the connection section 390, 395 electrically connects the optoelectronic semiconductor components 35 arranged on the carrier layer 20 to the connection pad 85, 95, the optoelectronic semiconductor components 35 may be connected to the energy supply or the driver circuit in a simple manner. Furthermore, the optoelectronic semiconductor components 35 may be driven in a simple manner by virtue of the parallel interconnection.

The invention has been illustrated and described in more specific detail on the basis of the preferred exemplary embodiments. Nevertheless, the invention is not restricted to the examples disclosed. Rather, other variations may be derived therefrom by the person skilled in the art, without departing from the scope of protection of the invention.

LIST OF REFERENCE SIGNS

5 Coordinate system
10 Arrangement
15 Textile
20 Elastic carrier layer
21 Structured contact layer
25 First conductive layer
26 Second conductive layer
30 Array
35 Optoelectronic semiconductor component
40 Conversion layer
45 Side face
50 First top side (of the elastic carrier layer)
55 First underside (of the elastic carrier layer)
60 Connection region
65 Radiation region
70 Second underside (of the structured contact layer)
71 Cohesive connection
80 Second top side (of the first conductive layer)
85 First connection pad
90 Third top side (of the second conductive layer)
95 Second connection pad
100 Edge region
105 Interspace
110 First contact pad
115 Second contact pad
120 Fourth top side
130 Chip top side
135 Chip side face
140 Constriction
145 First elastic connecting layer
150 Second elastic connecting layer
160 Mold
165 Mold space
170 First (upper) mold shell
175 Second (lower) mold shell
180 First protuberance
181 Second protuberance
185 Depression
190 Composite
195 Sectional line
200 First method step
205 Second method step
210 Third method step
215 Fourth method step
220 Fifth method step
225 Sixth method step
230 Seventh method step
235 Eighth method step
240 Ninth method step
245 Tenth method step
250 Eleventh method step
255 Twelfth method step
260 Thirteenth method step
300 First cavity
305 Second cavity
310 Web
315 First cavity base
320 Second cavity base
325 First material
330 Second material
335 Third material
340 Fourth material
345 First layer of the conductive adhesive
350 Second layer of the conductive adhesive
355 Matrix material
360 Conversion material
366 Mold top side of the lower second mold shell
370 Protective film
375 Protuberance underside
380 First edge region
385 Second edge region
390 First connecting section
395 Second connecting section
400 First method step
405 Second method step
410 Third method step
415 Fourth method step
420 Fifth method step
425 Sixth method step
430 Seventh method step 435 Eighth method step
440 Ninth method step
445 Tenth method step
450 Eleventh method step
455 Twelfth method step

The invention claimed is:

1. A method for producing an arrangement,
wherein a structured contact layer and an elastic carrier layer arranged at a first side of the structured contact layer and connected to the structured contact layer by means of a cohesive connection are provided,
wherein on a second side of the structured contact layer located opposite the first side, at least one optoelectronic semiconductor component is arranged on the structured contact layer, in a radiation region of the arrangement, and is electrically and mechanically connected to the structured contact layer,
wherein an elastic conversion layer is applied to the structured contact layer and the elastic carrier layer, in the radiation region of the arrangement, in such a way that the at least one at least optoelectronic semiconductor component is embedded in the elastic conversion layer at least in sections and a top side of the structured contact layer is in a connection region of the arrangement, remains uncovered by the elastic conversion layer,
wherein a mold is heated to a predefined temperature,
wherein a first reactant and a second reactant are introduced into a mold space of the mold,
wherein at least a first portion of the first reactant and of the second reactant crosslink with one another to form an elastic first material of the elastic carrier layer,
wherein temporally following the crosslinking of the first portion of the first reactant and second reactant, the structured contact layer is applied to the partly crosslinked elastic carrier layer, and
wherein temporally following the application of the structured contact layer to the elastic carrier layer, a second portion of the first reactant and of the second reactant crosslink to form the first material of the elastic carrier layer and the cohesive connection to the structured contact layer is formed.

2. The method according to claim 1,
wherein the structured contact layer is cut or stamped from a metal film,
wherein temporally following the at least partial removal of the elastic carrier layer from the mold, the first side of the structured contact layer is placed areally onto the elastic carrier layer,
wherein the structured contact layer and the elastic carrier layer are pressed together.

3. The method according to claim 1,
wherein the top side of the structured contact layer is facing away from the elastic carrier layer.

4. The method according to claim 1,
wherein the elastic carrier layer comprises a first carrier matrix,
wherein the first carrier matrix comprises a first elastic material, and
wherein the first elastic material comprises a tensile strength in a range of 1 MPa to 10 MPa.

5. The method according to claim 1,
wherein the elastic carrier layer comprises a first carrier matrix,
wherein the first carrier matrix comprises a first elastic material, and
wherein the first elastic material is bendable by at least 20 degrees without reversible damage.

6. A method for producing an arrangement,
wherein a structured contact layer and an elastic carrier layer arranged at a first side of the structured contact layer and connected to the structured contact layer by means of a cohesive connection are provided,
wherein on a second side of the structured contact layer located opposite the first side, at least one optoelectronic semiconductor component is arranged on the structured contact layer, in a radiation region of the arrangement, and is electrically and mechanically connected to the structured contact layer,
wherein an elastic conversion layer is applied to the structured contact layer and the elastic carrier layer, in the radiation region of the arrangement, in such a way that the at least one at least optoelectronic semiconductor component is embedded in the elastic conversion layer at least in sections and a top side of the structured contact layer is in a connection region of the arrangement, remains uncovered by the elastic conversion layer,
wherein a mold is heated to a predefined temperature,
wherein a first reactant and a second reactant are introduced into a mold space of the mold,
wherein at least a first portion of the first reactant and of the second reactant crosslink with one another to form an elastic first material of the elastic carrier layer,
wherein at least one first cavity of the elastic carrier layer is formed,
wherein a third reactant and a fourth reactant are introduced into the first cavity,
wherein the third reactant and the fourth reactant crosslink with one another and form the structured contact layer in the first cavity.

7. The method according to claim 6,
wherein temporally following the introduction of the third reactant and the fourth reactant into the first cavity, a second portion of the first reactant and of the second reactant crosslink to form the first material of the elastic carrier layer and at the same time the third reactant and the fourth reactant crosslink with one another and form the structured contact layer in the first cavity.

8. The method according to claim 6,
wherein the first reactant and the third reactant and/or the second reactant and the fourth reactant are identical.

9. The method according to claim 6,
wherein the third reactant and/or the fourth reactant are introduced into the first cavity by means of screen printing or by means of a dispenser.

10. A method for producing an arrangement,
wherein a structured contact layer and an elastic carrier layer arranged at a first side of the structured contact layer and connected to the structured contact layer by means of a cohesive connection are provided,
wherein on a second side of the structured contact layer located opposite the first side, at least one optoelectronic semiconductor component is arranged on the structured contact layer, in a radiation region of the arrangement, and is electrically and mechanically connected to the structured contact layer,
wherein an elastic conversion layer is applied to the structured contact layer and the elastic carrier layer, in the radiation region of the arrangement, in such a way that the at least one at least optoelectronic semiconductor component is embedded in the elastic conversion layer at least in sections and a top side of the structured contact layer is in a connection region of the arrangement, remains uncovered by the elastic conversion layer, wherein a layer of a conductive adhesive is applied to the second side of the structured contact layer, wherein the at least one optoelectronic semiconductor component is placed onto the layer by way of at least one first contact pad, or wherein a layer of a conductive adhesive is applied on a first contact pad of the at least one optoelectronic semiconductor component, wherein the at least one optoelectronic semiconductor component is placed onto the second side of the structured contact layer by way of the layer, wherein the conductive adhesive is cured to form a conductive, elastic connecting layer.

* * * * *